US012782422B2

(12) United States Patent
Park et al.

(10) Patent No.: US 12,782,422 B2
(45) Date of Patent: Nov. 3, 2026

(54) MULTI-WAFER INSPECTION SYSTEM

(71) Applicant: SEMICS INC., Gwangju-si (KR)

(72) Inventors: Ki Tack Park, Suwon-si (KR); Jinhee Kim, Gwangju-si (KR); Sangyeong Han, Daejeon (KR)

(73) Assignee: SEMICS INC., Gyeonggi-Do (KR)

( * ) Notice: Subject to any disclaimer, the term of this patent is extended or adjusted under 35 U.S.C. 154(b) by 157 days.

(21) Appl. No.: 18/834,044

(22) PCT Filed: Jun. 16, 2023

(86) PCT No.: PCT/KR2023/008354
§ 371 (c)(1),
(2) Date: Jul. 29, 2024

(87) PCT Pub. No.: WO2023/244066
PCT Pub. Date: Dec. 21, 2023

(65) Prior Publication Data
US 2025/0155492 A1 May 15, 2025

(30) Foreign Application Priority Data
Jun. 17, 2022 (KR) ........................ 10-2022-0074220

(51) Int. Cl.
*G01R 31/28* (2006.01)
*G01N 21/95* (2006.01)
*G01R 1/073* (2006.01)

(52) U.S. Cl.
CPC ..... *G01R 31/2863* (2013.01); *G01R 1/07342* (2013.01); *G01N 21/9505* (2013.01)

(58) Field of Classification Search
CPC ............ G01R 31/2863; G01R 1/07342; G01N 21/9505
See application file for complete search history.

(56) References Cited

U.S. PATENT DOCUMENTS 6,288,561 B1 * 9/2001 Leedy ................ G01R 31/2867 257/E23.06
10,690,599 B1 6/2020 Biellak et al.
(Continued)

FOREIGN PATENT DOCUMENTS

JP 2010157550 A 7/2010
JP 2017130681 A 7/2017
(Continued)

OTHER PUBLICATIONS

Translation of JP 2010-157550 A (Year: 2010).*
(Continued)

*Primary Examiner* — Paresh Patel
(74) *Attorney, Agent, or Firm* — MICHAEL BEST & FRIEDRICH LLP

(57) ABSTRACT

A multi-wafer inspection system is provided. A multi-wafer inspection system according to an aspect of the present invention is capable of simultaneously inspecting multiple wafers supplied thereto, and may comprise: a first stage unit comprising multiple first probers controlled such that the multiple wafers can be inspected individually, and disposed side by side in a first direction; a loader unit disposed in a second direction perpendicular to the first direction of the first stage unit such that the multiple wafers are supplied to the multiple first probers, respectively; a chiller unit for supplying a refrigerant to the multiple first probers; a controller disposed on the opposite side of the loader unit to the first direction in order to control the first probers; and multiple first conductive members for connecting the multiple first probers and the controller, respectively.

8 Claims, 12 Drawing Sheets

(56) References Cited

U.S. PATENT DOCUMENTS

| | | | | |
|---|---|---|---|---|
| 2011/0013013 | A1 | 1/2011 | Lee et al. | |
| 2015/0115991 | A1* | 4/2015 | Hagihara ........... | G01R 31/2893 324/756.01 |
| 2019/0041454 | A1* | 2/2019 | Akiyama ........... | G01R 31/2877 |
| 2020/0408835 | A1* | 12/2020 | Fujihara ............. | G01R 31/2831 |
| 2021/0364550 | A1* | 11/2021 | Kagami ............. | G01R 1/07307 |

FOREIGN PATENT DOCUMENTS

| | | | |
|---|---|---|---|
| JP | 2019029627 | A | 2/2019 |
| JP | 2020106388 | A | 7/2020 |
| JP | 2021005686 | A | 1/2021 |
| KR | 20100119716 | A | 11/2010 |
| KR | 1020170100553 | A | 9/2017 |
| KR | 20190015135 | A | 2/2019 |
| KR | 20210019193 | A | 2/2021 |
| KR | 1020210043040 | A | 4/2021 |
| KR | 1020220045649 | A | 4/2022 |

OTHER PUBLICATIONS

Japanese Patent Office Decision to Grant for Application No. 2024-545014 dated Nov. 11, 2025 (7 pages including English machine translation).

Korean Patent Office Action for Application No. 10-2022-0074220 dated Feb. 18, 2025 (10 pages including partial English machine translation).

International Search Report for Application No. PCT/KR2023/008354 dated Sep. 15, 2023 (4 pages including English machine translation).

* cited by examiner

F1 : F11, F12
F2 : F21, F22
F3 : F31, F32
F4 : F41, F42
F5 : F51, F52
F6 : F61, F62

<"G" Enlarged View>

<"H" Enlarged View>

F1 : F11, F12
F2 : F21, F22
F3 : F31, F32
F4 : F41, F42
F5 : F51, F52
F6 : F61, F62

MULTI-WAFER INSPECTION SYSTEM

TECHNICAL FIELD

The present invention relates to a multi-wafer inspection system, and more particularly, to a multi-wafer inspection system capable of individually controlling a plurality of probers.

BACKGROUND

Wafer prober, which is a semiconductor inspection equipment, is equipment that checks the electrical characteristics of semiconductor devices made on a wafer to confirm the presence or absence of defects just before the wafer, which has completed all of the semiconductor pre-processing, enters the post-processing.

In a semiconductor wafer on which a number of semiconductor devices are formed, a prober is used as a wafer inspection apparatus to inspect the electrical characteristics of each semiconductor device. The prober has a disc-shaped probe card facing the wafer, and the probe card has contact probes, which are a plurality of pillar-shaped contact terminals arranged to face each electrode pad or each solder bump of a semiconductor device of the wafer.

In a prober, each contact probe of a probe card comes into contact with an electrode pad or solder bump of a semiconductor device, and a test signal is passed from each contact probe to the electric circuit of the semiconductor device connected to each electrode pad or each solder bump, thereby testing the continuity of the electric circuit, etc.

As semiconductor chips have become more integrated in recent years, the number of semiconductors placed on a single wafer is increasing. Accordingly, not only is the time required to inspect a single wafer relatively increasing, but a higher level of cleanliness in the inspection space than before is also required to reduce inspection errors.

Recently, as the degree of integration of semiconductor devices on a wafer increases, the time it takes for a single prober to inspect a wafer is increasing. Accordingly, in order to improve wafer inspection efficiency, a multi-wafer inspection system is being developed that loads probers in multiple stages to inspect semiconductor devices of multiple wafers in multiple probers.

However, the multi-wafer inspection system consisting of such multi-stage loaded probers had the problem of making it difficult to transport the entire system at once because the entire system was large and heavy. Accordingly, there was a problem that a long time and manpower were consumed in preparing the system because the system had to be assembled and installed directly at the installation site rather than transporting the entire system.

In particular, in the process of reducing the size of a multi-wafer inspection system, there was a problem that the internal space became narrow, making it difficult to efficiently place conductive members connected to multiple probers inside the system, and connecting multiple conductive members was complicated.

SUMMARY OF THE INVENTION

Technical Problem

The present invention is to solve the above problems, and the present invention is directed to providing a multi-wafer inspection system that is easy to install because it can efficiently arrange a plurality of conductive members.

In addition, the present invention is directed to providing a multi-wafer inspection system capable of reducing the overall size of the system by efficiently arranging a plurality of conductive members.

The problems of the present invention are not limited to those mentioned above, and other problems not mentioned will be clearly understood by those of ordinary skill in the art from the following description.

Technical Solution

A multi-wafer inspection system according to an aspect of the present invention is capable of simultaneously inspecting multiple wafers supplied thereto, and may comprise: a first stage unit comprising multiple first probers controlled such that the multiple wafers can be inspected individually, and disposed side by side in a first direction; a loader unit disposed in a second direction perpendicular to the first direction of the first stage unit such that the multiple wafers are supplied to the multiple first probers, respectively; a chiller unit for supplying a refrigerant to the multiple first probers; a controller disposed on the opposite side of the loader unit to the first direction in order to control the first probers; and multiple first conductive members for connecting the multiple first probers and the controller, respectively.

In this case, the loader unit may include a connection space formed on a third direction side perpendicular to the first direction and the second direction of the loader unit, and the first conductive member may connect the first prober and the controller via the connection space.

In this case, the first stage unit may further include a conductive member auxiliary space formed on one side of the first stage unit, and the first conductive member may sequentially pass through the conductive member auxiliary space and the connection space to connect the first prober to the controller.

In this case, one end of the loader unit may extend to the conductive member auxiliary space of the first stage unit.

In this case, the first stage unit may further include multiple first electric connection spaces extending in the third direction, respectively, on one side of the multiple first probers as opposite sides of the second direction of the first stage unit; and a second electric connection space extending along the first direction on the opposite side of the third direction of the first stage unit and coupled to ends on the opposite side of the third direction of the multiple first electric connection spaces, and the first conductive member may sequentially pass through the first electric connection space, the second electric connection space, the conductive member auxiliary space, and the connection space to connect the first prober to the controller.

In this case, the first stage unit may further include multiple second probers disposed parallel to each other in the first direction, stacked on the third direction side of the multiple first probers, and controlled by the controller, and the multi-wafer inspection system may further include multiple second conductive members for connecting the multiple second probers and the controller, respectively.

In this case, the second conductive member may sequentially pass through the conductive member auxiliary space and the connection space to connect the second prober to the controller.

In this case, the first prober may include a first electric space formed on the side of the first prober in a direction opposite to the second direction, and the first conductive member may sequentially pass through the first electric space, the first electric connection space, the second electric connection space, the conductive member auxiliary space, and the connection space to connect the first prober to the controller.

In this case, the multi-wafer inspection system may further include a first stage unit detachably coupled to a first direction side of the first stage unit and including multiple third probers controlled by the controller such that the multiple wafers can be inspected individually, and disposed side by side in the first direction; and multiple third conductive members for connecting the multiple third probers and the controller, respectively, and the loader unit may be detachably coupled to a second direction side perpendicular to the first direction of the first stage unit and the second stage unit, and supply the multiple wafers to the multiple first probers and the multiple third probers, respectively.

In this case, the second stage unit may further include multiple third electric connection spaces extending in the third direction, respectively, on one side of the multiple third probers as opposite sides of the second direction of the second stage unit; and a fourth electric connection space extending along the first direction on the opposite side of the third direction of the second stage unit, coupled to ends on the opposite side of the third direction of the multiple third electric connection spaces, and arranged at a position corresponding to the position of the second electric connection space along the third direction, and the third conductive member may sequentially pass through the third electric connection space, the fourth electric connection space, the second electric connection space, the conductive member auxiliary space, and the connection space to connect the third prober to the controller.

In this case, the third prober may include a third electric space formed on the side of the third prober in a direction opposite to the second direction, and the third conductive member may sequentially pass through the third electric space, the third electric connection space, the fourth electric connection space, the second electric connection space, the conductive member auxiliary space, and the connection space to connect the third prober to the controller.

Advantageous Effects

The multi-wafer inspection system according to an exemplary embodiment of the present invention allows for easily and efficiently arranging multiple conductive members by efficiently arranging the space through which the conductive members pass within the stage unit, and also to reduce the overall size of the system.

Advantageous effects of the present invention are not limited to the above-described effects and should be understood to include all effects that can be inferred from the configuration of the invention described in the description or claims of the present invention.

DETAILED DESCRIPTION OF THE EMBODIMENTS

Figure 1:
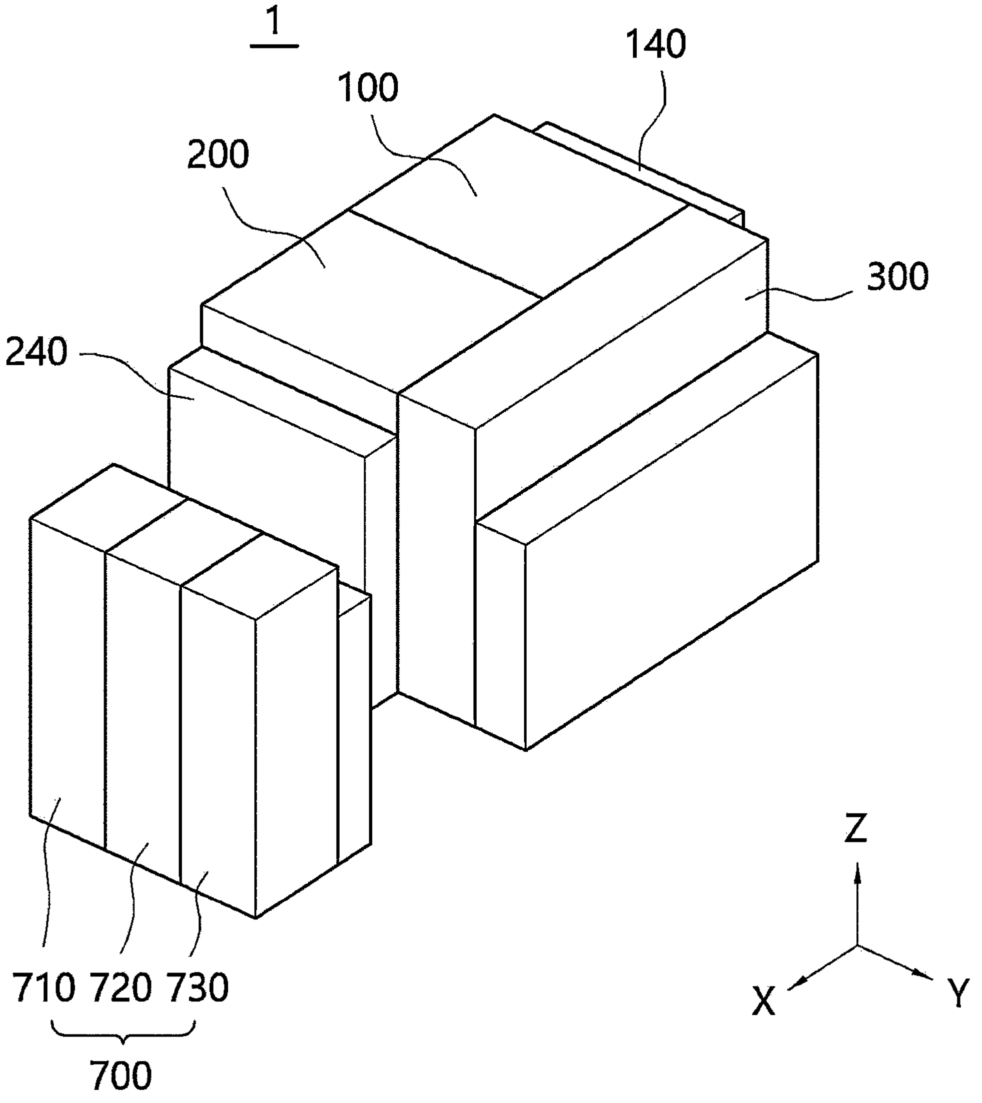
FIG. 1 is a perspective view of a multi-wafer inspection system according to an exemplary embodiment of the present invention.

Hereinafter, exemplary embodiments of the present invention will be described in detail so that those of ordinary skill in the art can readily implement the present invention with reference to the accompanying drawings. The present invention may be embodied in many different forms and is not limited to the embodiments set forth herein. In the drawings, parts unrelated to the description are omitted for clarity of description of the present invention, and throughout the specification, same or similar reference numerals denote same elements.

Terms and words used in the present specification and claims should not be construed as limited to their usual or dictionary definition. They should be interpreted as meaning and concepts consistent with the technical idea of the present invention, based on the principle that inventors may appropriately define the terms and concepts to describe their invention in the best way.

Accordingly, the embodiments described in the present specification and the configurations shown in the drawings correspond to preferred embodiments of the present invention, and do not represent all the technical idea of the present invention, so the configurations may have various examples of equivalent and modification that can replace them at the time of filing the present invention.

It should be understood that the terms "comprise" or "have" or the like when used in this specification, are intended to describe the presence of stated features, integers, steps, operations, elements, components and/or a combination thereof but not preclude the possibility of the presence or addition of one or more other features, integers, steps, operations, elements, components, or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Figure 2:
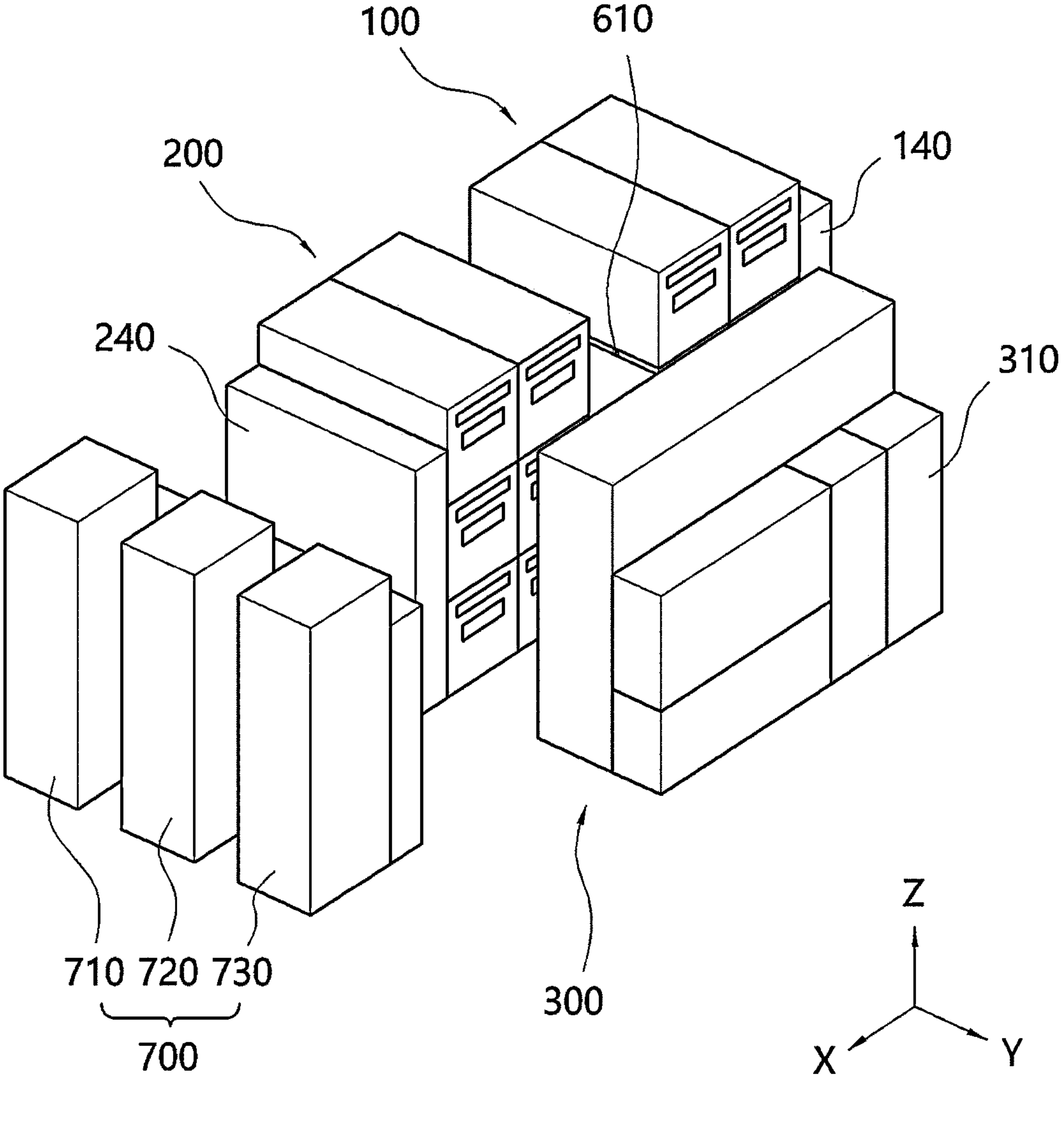
FIG. 2 is a exploded perspective view of a multi-wafer inspection system according to an exemplary embodiment of the present invention.
Figure 3:
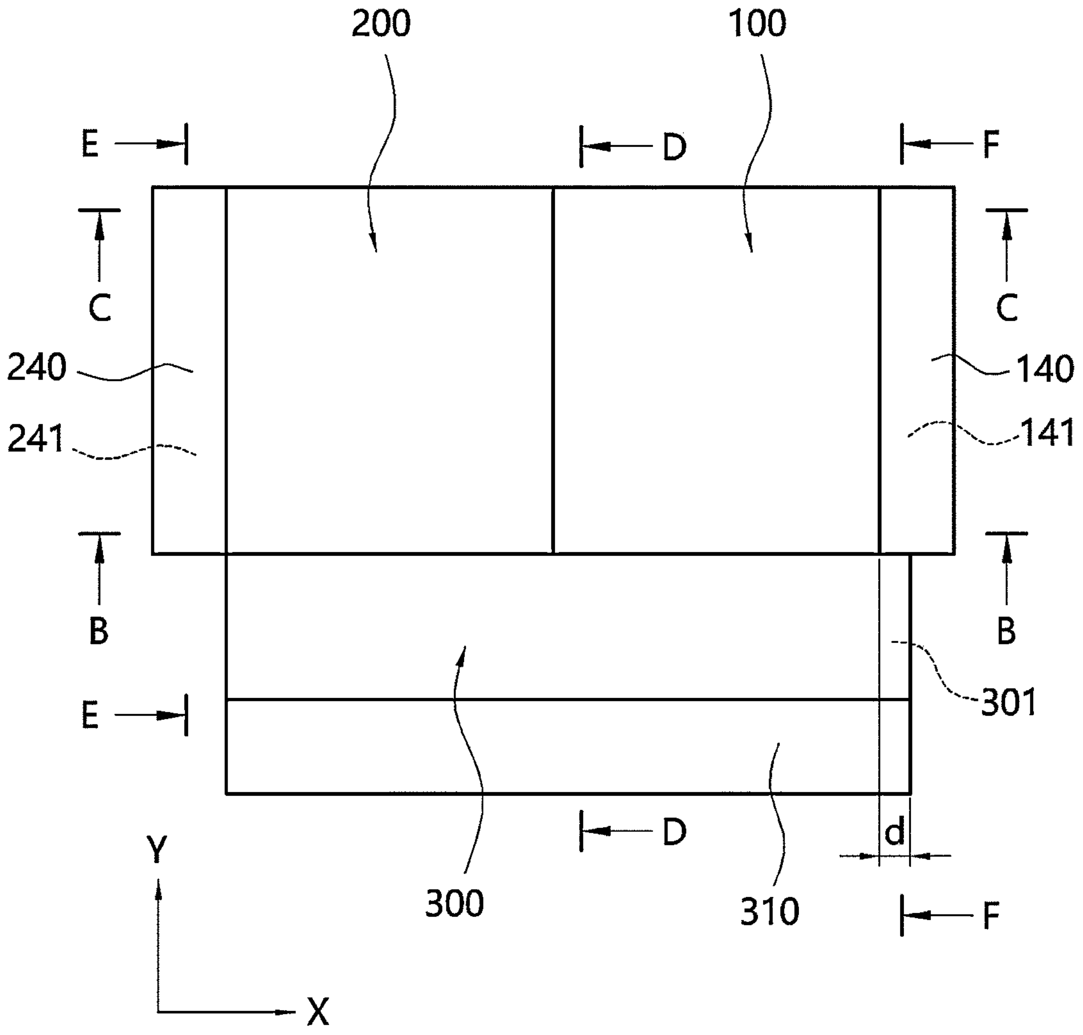
FIG. 3 is a top view of a multi-wafer inspection system according to an exemplary embodiment of the present invention.
Figure 4:
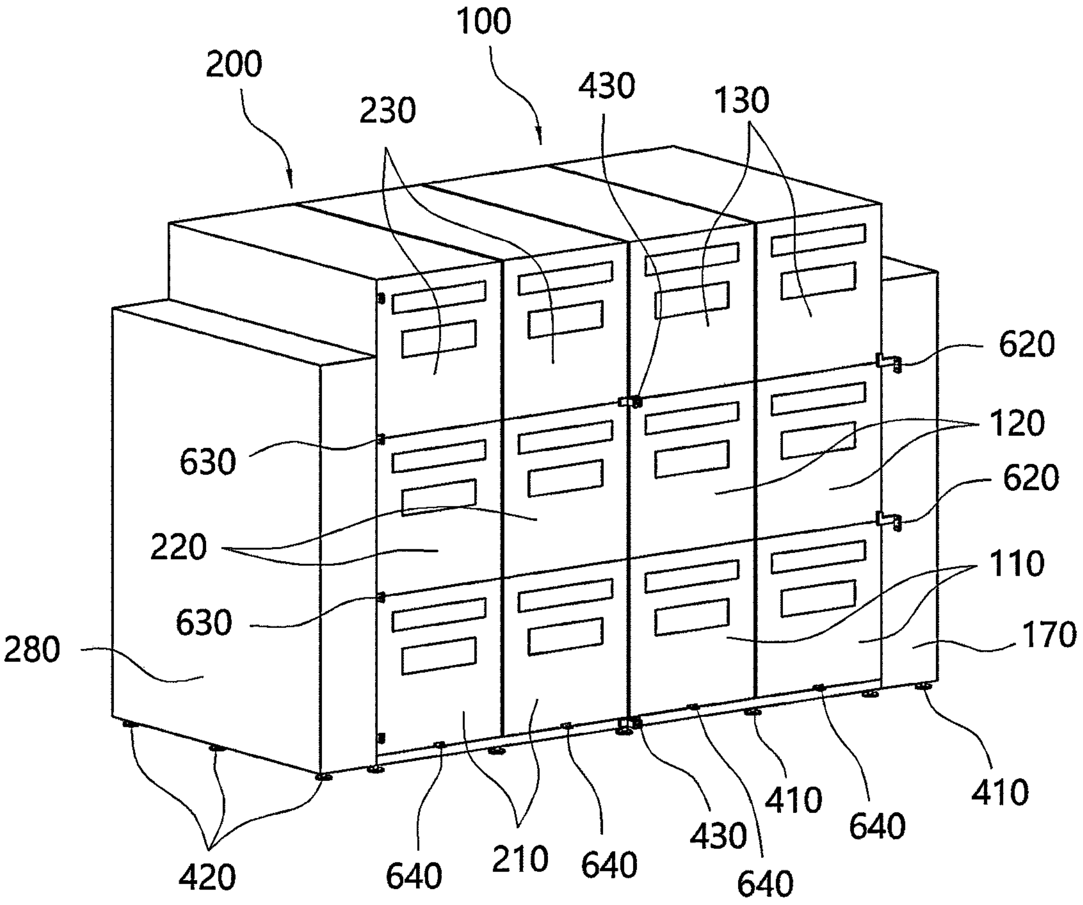
FIG. 4 is a perspective view of a first stage unit and a second stage unit of a multi-wafer inspection system according to an exemplary embodiment of the present invention.
Figure 5:
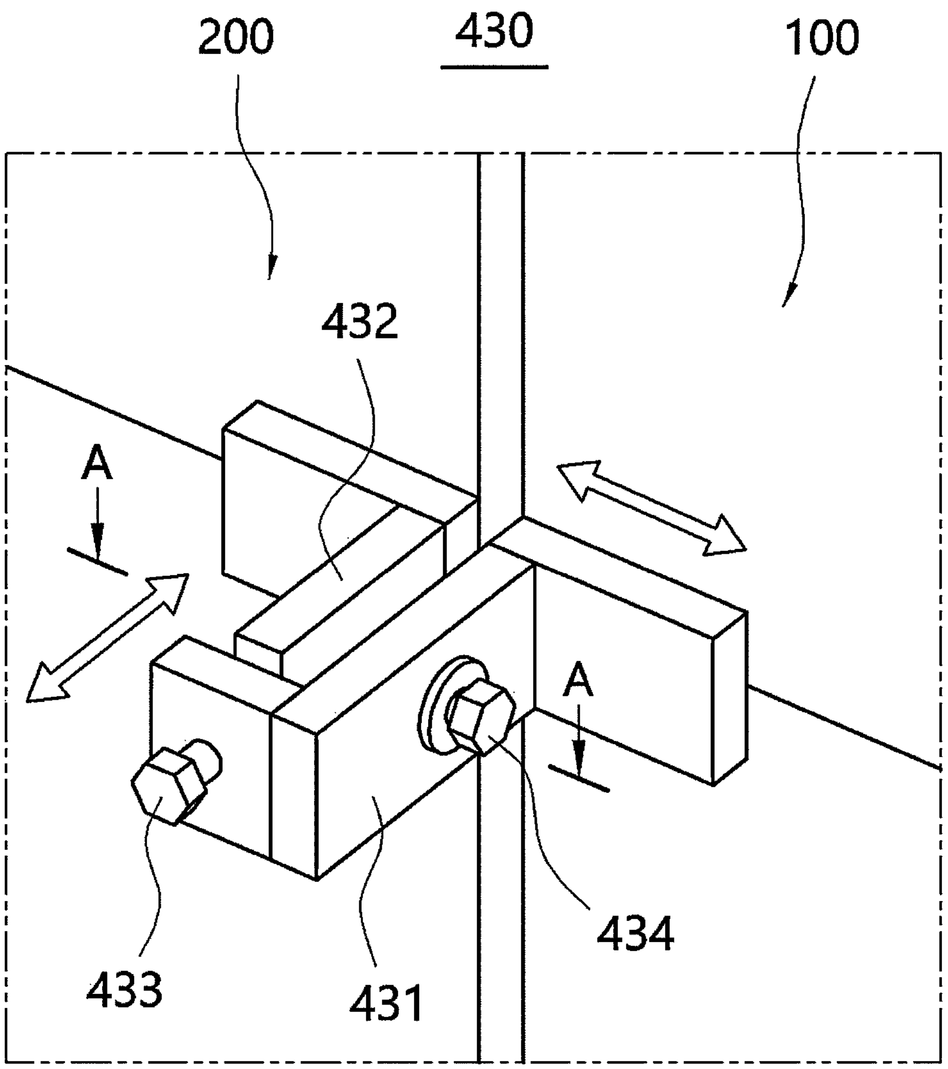
FIG. 5 is a perspective view of a third alignment member of a multi-wafer inspection system according to an exemplary embodiment of the present invention.
Figure 6:
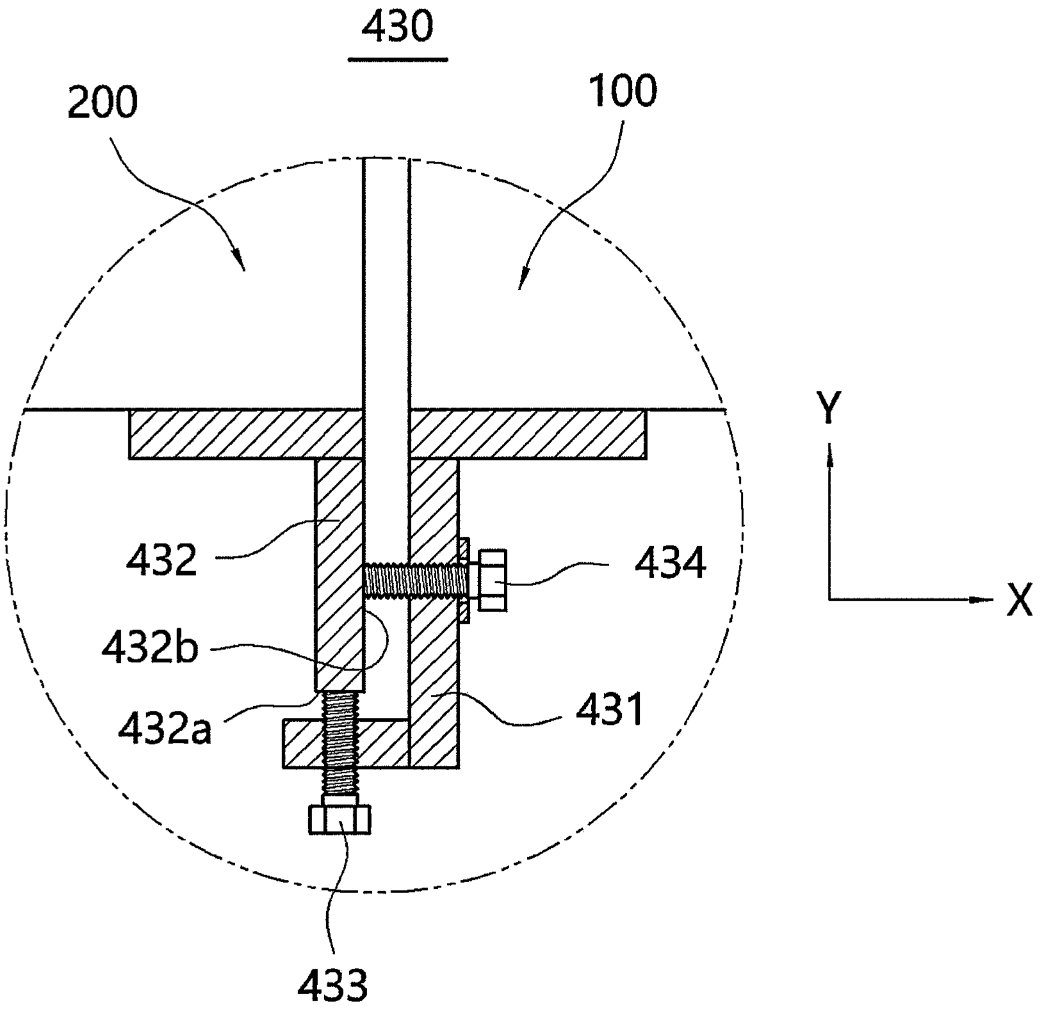
FIG. 6 is a cross-sectional view illustrating a cross-section taken along line A-A of FIG. 5.
Figure 7:
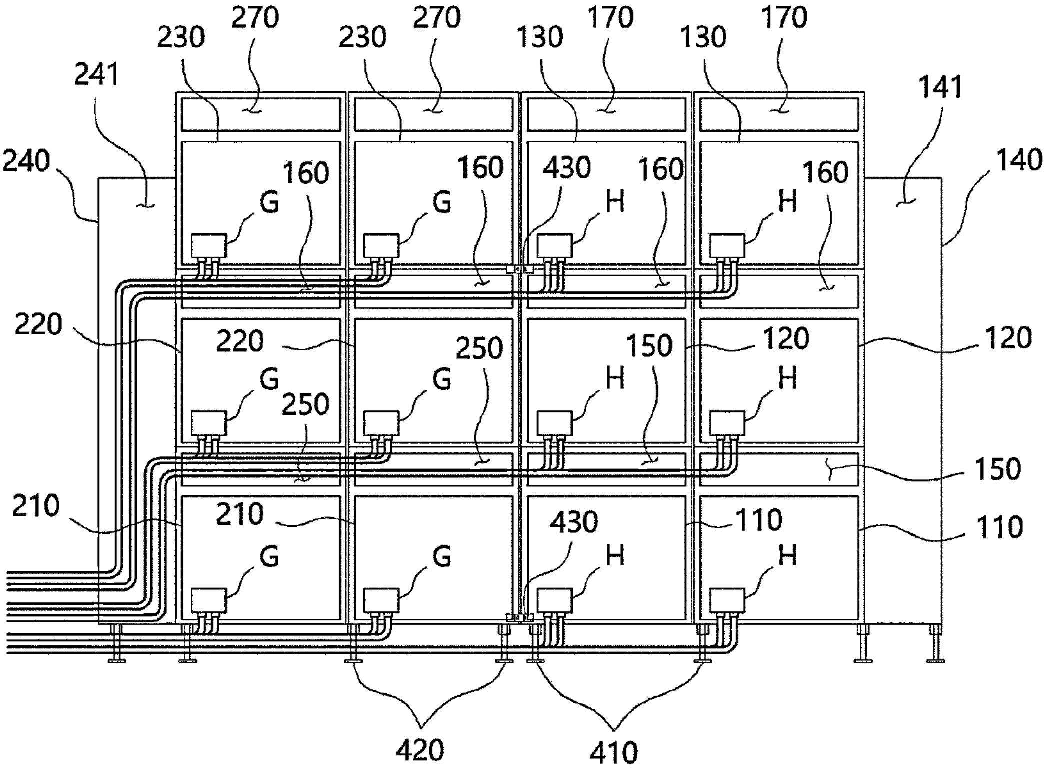
FIG. 7 is a cross-sectional view illustrating a cross-section taken along line B-B of FIG. 3.
Figure 8:
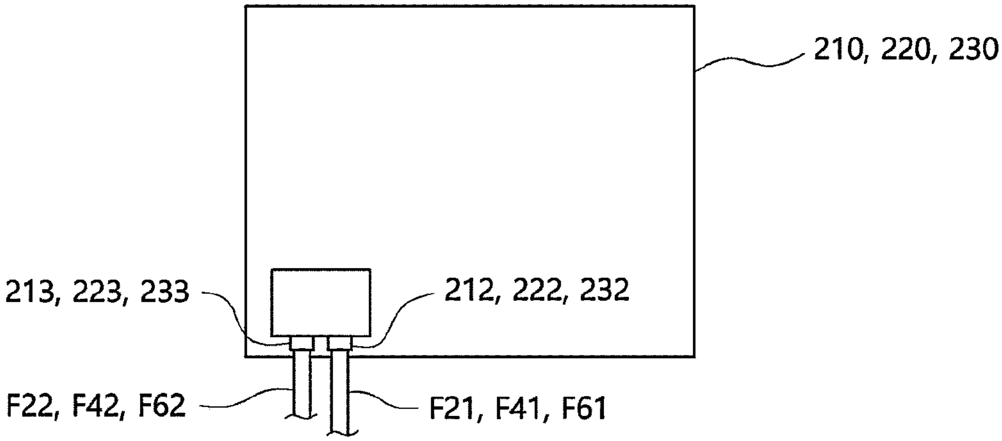
FIG. 8 is an enlarged view of portions H and G of FIG. 7.
Figure 8:
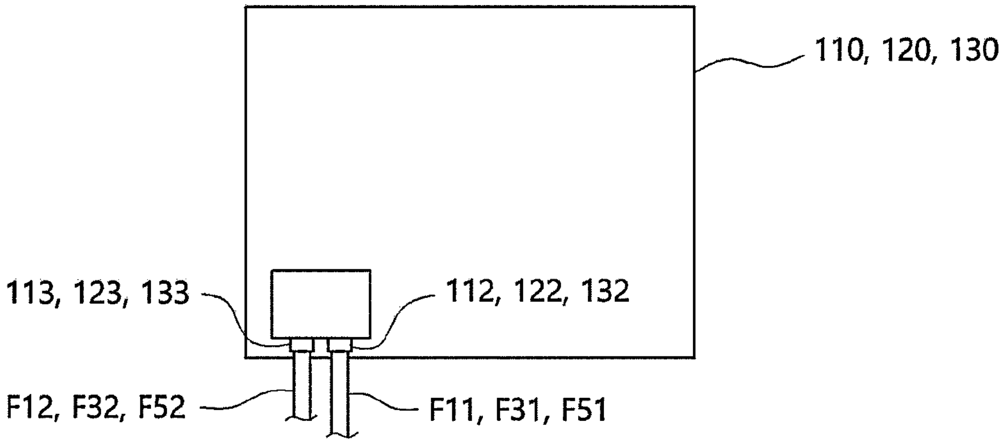
Figure 9:
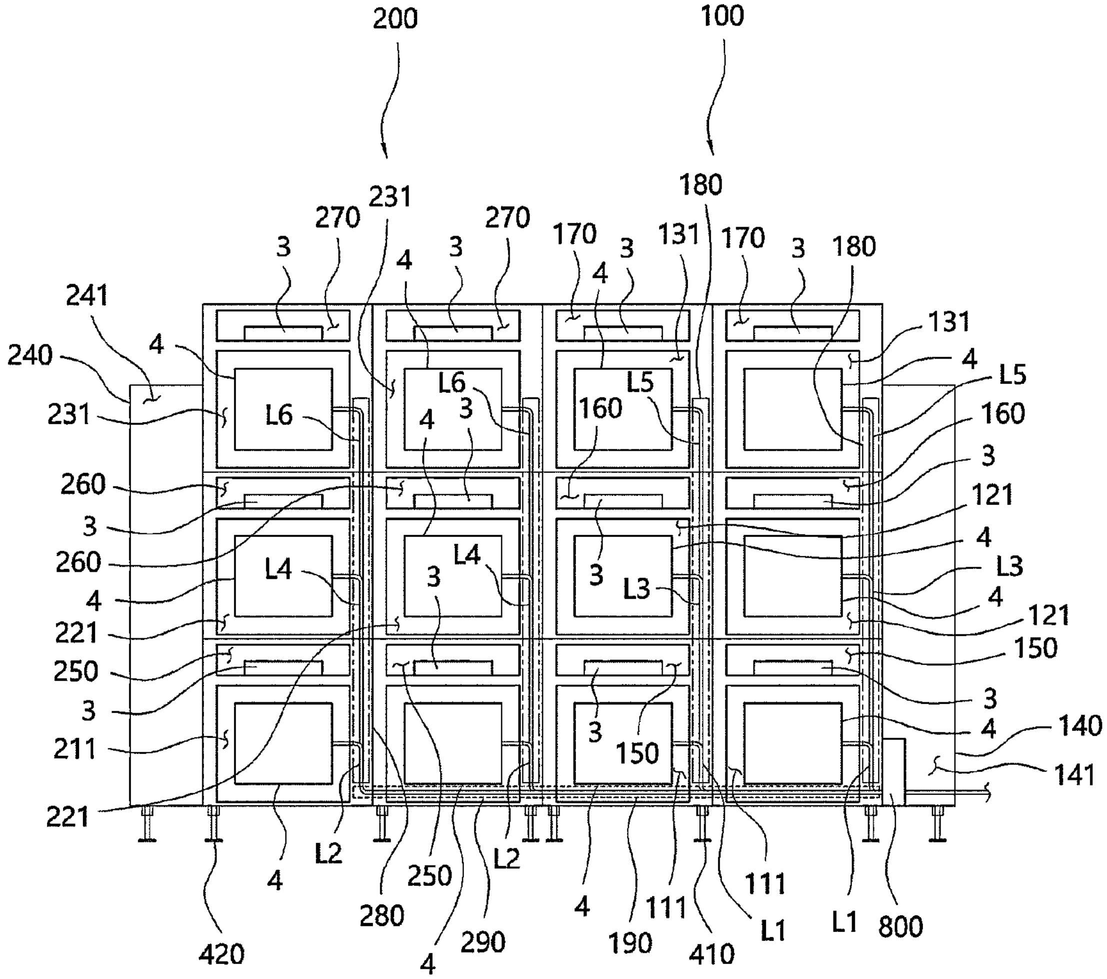
FIG. 9 is a cross-sectional view illustrating a cross-section taken along line C-C of FIG. 3.
Figure 10:
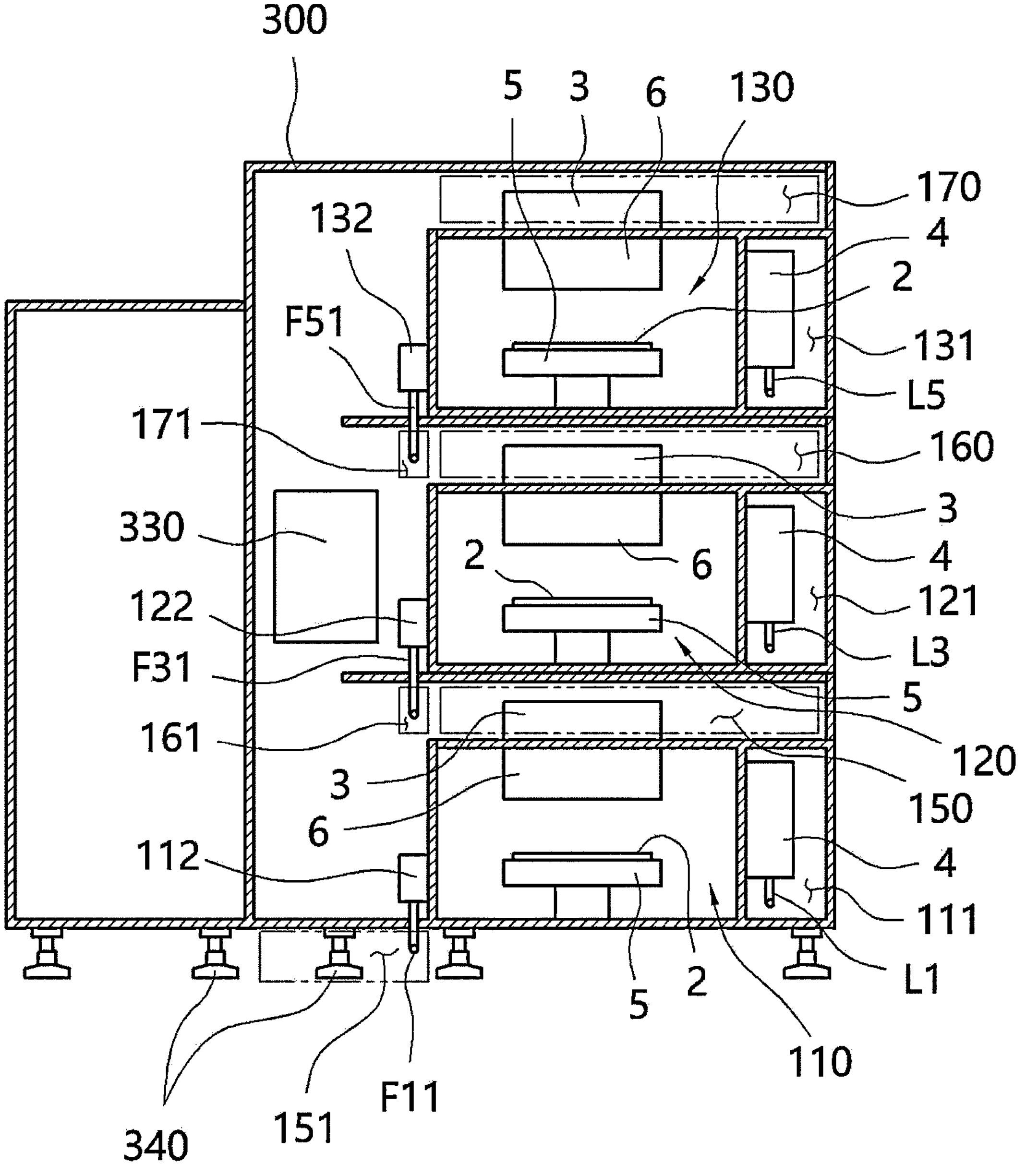
FIG. 10 is a cross-sectional view illustrating a cross-section taken along line D-D of FIG. 3.
Figure 11:
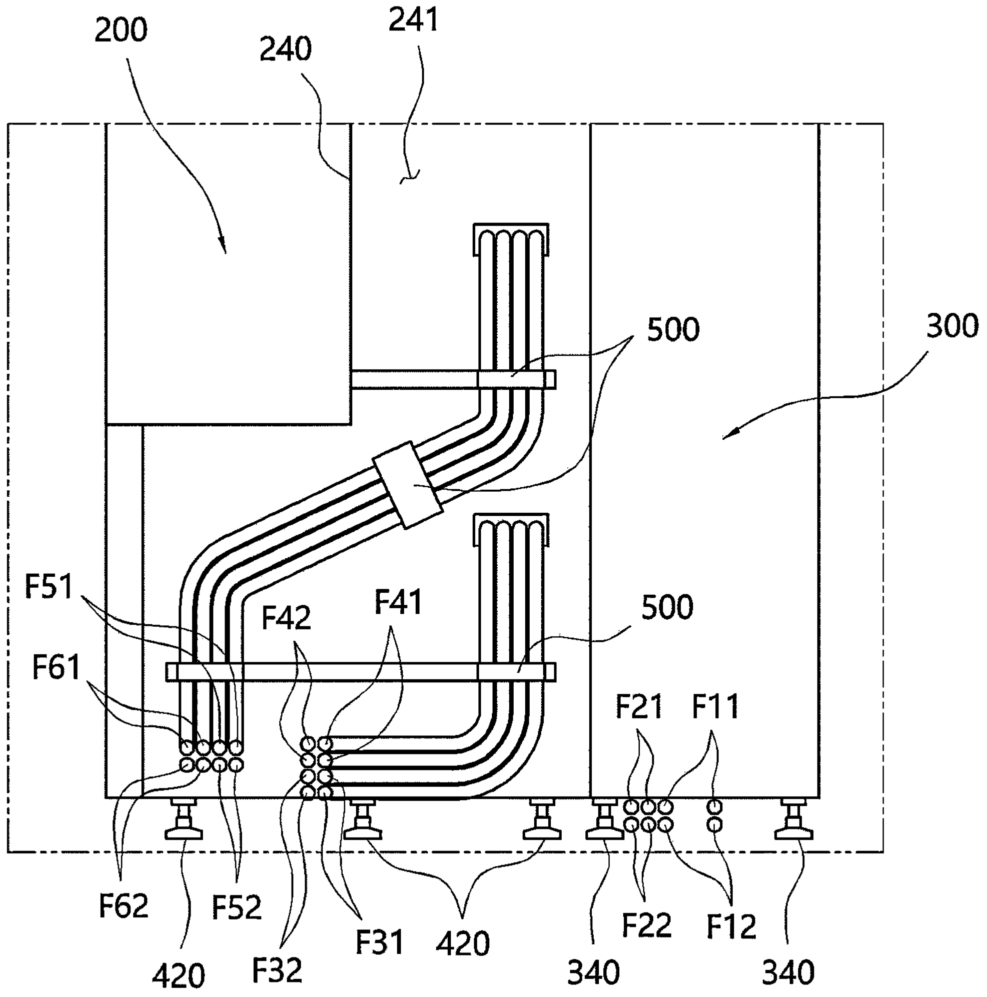
FIG. 11 is a cross-sectional view illustrating a cross-section taken along line E-E of FIG. 3.
Figure 12:
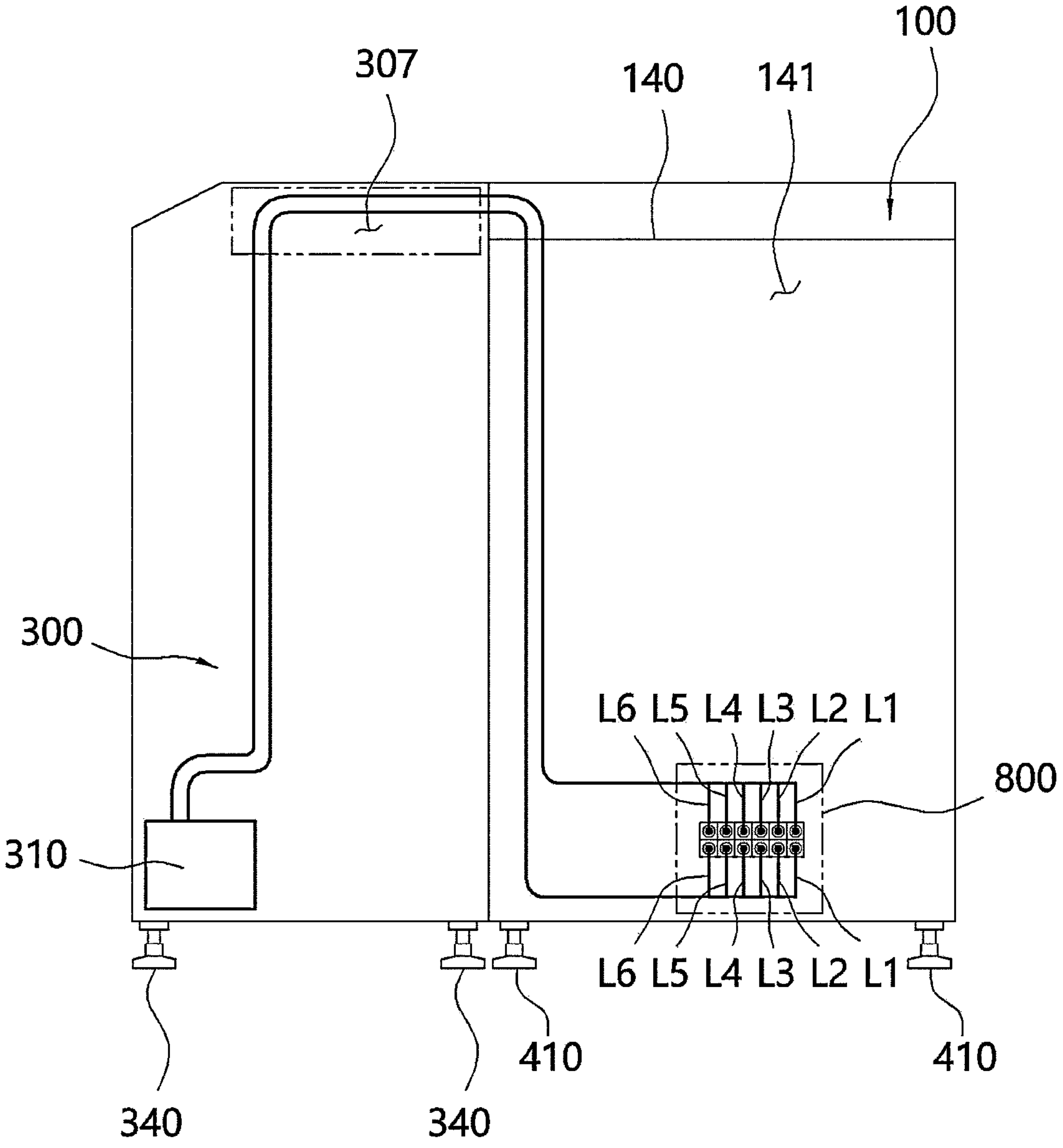
FIG. 12 is a cross-sectional view illustrating a cross-section taken along line F-F of FIG. 3.

Hereinafter, a multi-wafer inspection system 1 according to an exemplary embodiment of the present invention will be described with reference to the drawings. In this case, FIG. 1 is a perspective view of a multi-wafer inspection system according to an exemplary embodiment of the present invention. FIG. 2 is a exploded perspective view of a multi-wafer inspection system according to an exemplary embodiment of the present invention. FIG. 3 is a top view of a multi-wafer inspection system according to an exemplary embodiment of the present invention. FIG. 4 is a perspective view of a first stage unit and a second stage unit of a multi-wafer inspection system according to an exemplary embodiment of the present invention. FIG. 5 is a perspective view of a third alignment member of a multi-wafer inspection system according to an exemplary embodiment of the present invention. FIG. 6 is a cross-sectional view illustrating a cross-section taken along line A-A of FIG. 5. FIG. 7 is a cross-sectional view illustrating a cross-section taken along line B-B of FIG. 3. FIG. 8 is an enlarged view of portions H and G of FIG. 7. FIG. 9 is a cross-sectional view illustrating a cross-section taken along line C-C of FIG. 3. FIG. 10 is a cross-sectional view illustrating a cross-section taken along line D-D of FIG. 3. FIG. 11 is a cross-sectional view illustrating a cross-section taken along line E-E of FIG. 3. FIG. 12 is a cross-sectional view illustrating a cross-section taken along line F-F of FIG. 3.

Hereinafter, to describe a direction in which the X-axis of FIG. 1 faces is defined as a lateral direction as a first direction, a direction in which the Y-axis faces is defined as a front direction as a second direction, and a direction in which the Z-axis faces is defined as an upward direction as a third direction.

The multi-wafer inspection system 1 according to an exemplary embodiment of the present invention is a system capable of simultaneously inspecting multiple wafers supplied thereto. To this end, as shown in FIGS. 1 and 2, the multi-wafer inspection system 1 according to an exemplary embodiment of the present invention includes a first stage unit 100 and a loader unit 300.

The multi-wafer inspection system 1 according to an exemplary embodiment of the present invention is formed by combining the first stage unit 100 and the loader unit 300. In this case, the first stage unit 100 and the loader unit 300 may be formed integrally or may be formed detachably. In the present embodiment, it is described as being formed to be detachable.

In this case, the multi-wafer inspection system 1 according to an exemplary embodiment of the present invention may further include a second stage unit 200. The second stage unit 200 performs the same function as the first stage unit 100. By providing the second stage unit 200, it is possible to detachably form a stage unit in which a plurality of probers of the multi-wafer inspection system 1 are arranged. Accordingly, the first stage unit 100 and the second stage unit 200 can be separated and easily transported.

However, the second stage unit 200 is not necessarily required, and depending on the space for installation, the multi-wafer inspection system 1 can be configured by combining only the first stage unit 100 and the loader unit 300. In the present embodiment, it will be described that the second stage unit 200 is further included.

In this case, the multi-wafer inspection system 1 according to an exemplary embodiment of the present invention includes a loader unit 300, a first alignment member 410, a second alignment member 420, a third alignment member 430, a first coupling member 610, a second coupling member 620, a third coupling member 630, a fourth coupling member 640, and a chiller unit 700.

As shown in FIG. 2, the first stage unit 100 and the second stage unit 200 are provided with a plurality of first probers 110 and third probers 210 that are controlled to individually inspect a plurality of wafers.

In this case, the first prober 110 and the third prober 210 internally inspect a wafer 2 supplied from the loader unit 300 to be described later. In this case, there is no limit on the method of inspecting the wafer 2 inside the first prober 110 and the third prober 210, and various known components may be used. For example, as shown in FIGS. 3 and 10, a probe card 6 is provided on the upper side, a wafer chuck 5 is provided on the lower side, and the wafer chuck 5 is raised with the wafer 2 placed on the wafer chuck 5, and one surface of the wafer 2 is in contact with the probe card 6, so that the wafer 2 may be inspected.

As shown in FIGS. 2 and 4, a plurality of first probers 110 are disposed in parallel in the first direction X. There is no limit to the number of first probers 110 disposed. In the present embodiment, it is described that the two first probers 110 are disposed in the first direction X.

The first prober 110 is disposed to be opened and closed toward the loader unit 300 to be described later. Accordingly, the wafer may be supplied from the loader unit 300.

In addition, as shown in FIGS. 3 and 10, a first electric space 111 is formed at the rear of the first prober 110. An electric component 4 for operating the first prober 110 is disposed in the first electric space 111. The electric component 4 is connected to the controller 310 to be described later and is used to control the first prober 110.

The first electric space 111 may be formed to be opened and closed from the rear side. Accordingly, the user may maintain and repair the electric component 4 disposed in the first electric space 111 through the rear outside of the first stage unit 100.

As shown in FIG. 10, the first electric space 111 is disposed on the opposite side from the loader unit 300. That is, it is arranged spaced apart from a first refrigerant space 151 to be described later, which is arranged adjacent to the loader unit 300 side. This can prevent damage to the electric component due to cooling by the refrigerant, which may occur by being positioned adjacent to a first refrigerant flow path F1 positioned in the first refrigerant space 151.

Furthermore, by arranging the first refrigerant space 151 and the first electric space 111 to be spaced apart, the first refrigerant flow path F1 that does not require maintenance after installation is placed on the loader unit 300 side and the electric component 4 is placed in the first electric space 111 located in the rear, allowing users to easily access the electric component through the rear side and perform maintenance.

As shown in FIGS. 2 and 4, a plurality of third probers 210 are disposed in parallel in the first direction X. There is no limit to the number of third probers 210 disposed. In the present embodiment, it is described that the two third probers 210 are disposed in the first direction X.

The third prober 210 is also disposed to be opened and closed toward the loader unit 300 to be described later. Accordingly, the wafer may be supplied from the loader unit 300. The first prober 110 and the third prober 210 may be the same prober. In this case, the criterion for distinguishing between the first prober 110 and the third prober 210 is whether each prober is included in the first stage unit 100 or the second stage unit 200 and does not vary depending on the type of prober.

The third prober 210 is positioned corresponding to the first prober 110 along the third direction Z. That is, the first prober 110 and the third prober 210 are placed at the same height from the ground. Therefore, as shown in FIG. 4, the first prober 110 and the third prober 210 are arranged in parallel along the first direction X.

A third electric space 211 corresponding to the first electric space 111 of the first prober 110 is also formed at the rear of the third prober 210. In this case, since the third electric space 211 is distinguished as being formed in the third prober 210, and has the same shape and function as the first electric space 111, a description thereof is replaced with a description of the first electric space 111.

There is no limitation on the manner in which the first prober 110 and the third prober 210 are placed inside the first stage unit 100 and the second stage unit 200, respectively. For example, the first stage unit 100 and the second stage unit 200 may have a frame structure, and the first prober 110 and the third prober 210 may be detachably coupled to the frames of the first stage unit 100 and the second stage unit 200.

As shown in FIGS. 3 and 10, a first tester space 150 is formed inside the first stage unit 100. The first tester space 150 is formed above the first prober 110. There is no limitation on a method in which the first tester space 150 is formed. For example, it may be formed by the frame of the first stage unit 100.

A tester 3 connected to the probe card 6 disposed on the inner upper side of the first prober 110 is disposed in the first tester space 150. The tester 3 may inspect the wafer 2 by providing an electrical signal through the probe card 6.

As shown in FIGS. 3 and 10, a second refrigerant space 161 is formed in the second direction Y of the first tester space 150, that is, in front of the first tester space 150. The second refrigerant space 161 becomes a space through which a second refrigerant flow path F3 to be described later passes.

A third tester space 250 is formed inside the second stage unit 200. The third tester space 250 is formed above the third prober 210. There is no limitation on a method in which the third tester space 250 is formed. For example, it may be formed by the frame of the second stage unit 200.

A tester 3 connected to the probe card 6 disposed on the inner upper side of the third prober 210 is disposed in the third tester space 250. The tester 3 may inspect the wafer 2 by providing an electrical signal through the probe card 6.

A fourth refrigerant space 261 is formed in the second direction Y of the third tester space 250, that is, in front of the third tester space 250. The fourth refrigerant space 261 becomes a space through which a fourth refrigerant flow path F4 to be described later passes.

The second refrigerant space 161 and the fourth refrigerant space 261 are formed at the same height from the ground so as to be arranged parallel to each other in the first direction X. Accordingly, the second refrigerant flow path F3 to be described later may pass through the second refrigerant space 161 and the fourth refrigerant space 261.

Since the second refrigerant space 161 is disposed in front of the first tester space 150 and the fourth refrigerant space 261 is disposed in front of the third tester space 250, the multi-wafer inspection system 1 may be minimized without interfering with the installation of the tester 3 disposed in the first tester space 150 and the third tester space 250.

In particular, since the tester 3 may be installed by being inserted into the first tester space 150 from the rear of the first prober 110 and the third prober 210, the second refrigerant flow path F3 and the fourth refrigerant flow path F4 are not disposed on the moving space of the tester 3, so that the tester 3 may be easily installed and damage to the second refrigerant flow path F3 and the fourth refrigerant flow path F4 may be prevented.

As shown in FIG. 4, the first stage unit 100 of the multi-wafer inspection system 1 according to an exemplary embodiment of the present invention may further include a plurality of second probers 120, and the second stage unit 200 may further include a plurality of fourth probers 220.

In this case, the second prober 120 and the fourth prober 220 are only distinguished according to positions arranged with the first prober 110 and the third prober 210 and perform the same function, so a detailed description of the function will be omitted.

As shown in FIG. 4, the plurality of second probers 120 are disposed in parallel in the first direction X inside the first stage unit 100. There is no limit to the number of second probers 120, and in the present embodiment, two are disposed to correspond to the number of first probers 110. Accordingly, the first stage unit 100 includes the first prober 110 and the second prober 120 stacked on the upper side of the first prober 110.

The first stage unit 100 has a second tester space 160 formed above the plurality of second probers 120, respectively, to arrange the tester 3 coupled to the plurality of second probers 120. Like the first tester space 150, the second tester space 160 may be formed by the frame of the first stage unit 100. In this case, a fifth refrigerant space 171 may be formed in front of the second tester space 160. The fifth refrigerant space 171 becomes a space through which a fifth refrigerant flow path F5 to be described later passes.

As shown in FIG. 4, the plurality of fourth probers 220 are disposed in parallel in the first direction X inside the second stage unit 200. There is no limit to the number of fourth probers 220, and in the present embodiment, two are disposed to correspond to the number of third probers 210. Accordingly, the second stage unit 200 includes the third prober 210 and the fourth prober 220 stacked on the upper side of the third prober 210.

The second stage unit 200 has a fourth tester space 260 formed above the plurality of fourth probers 220, respectively, to arrange the tester 3 coupled to the plurality of fourth probers 220. Like the third tester space 250, the fourth tester space 260 may be formed by the frame of the second stage unit 200. In this case, a sixth refrigerant space 271 may be formed in front of the fourth tester space 260. The sixth refrigerant space 271 becomes a space through which a sixth refrigerant flow path F6 to be described later passes.

As shown in FIGS. 3 and 7, the fifth refrigerant space 171 and the sixth refrigerant space 271 are formed at the same height from the ground so as to be arranged parallel to each other in the first direction X. Accordingly, the fifth refrigerant flow path F5 to be described later may pass through the fifth refrigerant space 171 and the sixth refrigerant space 271. In this case, the description of the effects of the fifth refrigerant space 171 and the sixth refrigerant space 271 will be replaced with the description of the second refrigerant space 161 and the fourth refrigerant space 261.

As shown in FIG. 4, the first stage unit 100 and the second stage unit 200 may further include a prober in addition to the first prober 110 to fourth prober 220 described above. In this case, there is no limit on the number of additional probers provided.

In the present embodiment, the first stage unit 100 further includes two fifth probers 130. In this case, as shown in FIGS. 3 and 10, in order to arrange the tester 3 coupled to the fifth prober 130, the first stage unit 100 has a fifth tester space 170 above the fifth prober 130.

Accordingly, the first stage unit 100 may include the first prober 110, the first tester space 150, the second prober 120, the second tester space 160, the fifth prober 130, and the fifth tester space 170 from bottom to top.

Likewise, in the present embodiment, the second stage unit 200 further includes two sixth probers 230. In this case, in order to arrange the tester 3 coupled to the sixth prober 230, the second stage unit 200 has a sixth tester space 270 above the sixth prober 230.

Accordingly, the second stage unit 200 may include the third prober 210, the third tester space 250, the fourth prober 220, the fourth tester space 260, the sixth prober 230, and the sixth tester space 270 from bottom to top.

That is, in the present embodiment, a total of 6 probers are provided in three rows and two columns in the first stage unit 100, and a total of 6 probers are provided in three rows and two columns in the second stage unit 200, so a total of 12 probers are arranged.

However, hereinafter, the first prober 110 to the fourth prober 220 will be mainly described, and the descriptions of the fifth prober 130 and the sixth prober 230 will be replaced with the descriptions of the first prober 110 to the fourth prober 220.

Furthermore, the second prober 120, the fourth prober 220, the fifth prober 130, and the sixth prober 230 have a second electric space 121, a fourth electric space 221, a fifth electric space 131, and a sixth electric space 231 in which electric components are installed, formed at the rear, respectively, similar to the first prober 110 and the third prober 210 described above. In this case, since the second electric space 121 to the sixth electric space 231 are distinguished in a position where they are formed, and have the same shape and function as the first electric space 111, descriptions thereof are replaced with a description of the first electric space 111.

As shown in FIG. 2, the first stage unit 100 and the second stage unit 200 may be combined or separated. Accordingly, when installing the multi-wafer inspection system 1, the system can be easily installed by coupling the first stage unit 100 and the second stage unit (200) which are modular types after transportation rather than installing the multi-wafer inspection system 1 by assembling all parts at the installation site.

In this case, the second stage unit 200 is disposed on the first direction X side of the first stage unit 100 and is coupled after the first prober 110 and second prober 120 of the first stage unit 100 and the third prober 210 and fourth prober 220 of the second stage unit 200 are aligned so as to be arranged in parallel with each other.

In order to align the first stage unit 100 and the second stage unit 200, a first alignment member 410 is provided below the first stage unit 100. The first alignment member 410 aligns the position of the first stage unit 100 in the third direction Z.

To this end, a plurality of first alignment members 410 may be provided, and the plurality of first alignment members 410 may be arranged in a grid shape on the lower surface of the first stage unit 100.

Since a plurality of first alignment members 410 are provided, the first stage unit 100 may not only align its position in the third direction Z, but also align the horizontality of the first stage unit 100 with respect to its own weight. Through this, it is possible to prevent damage that may occur due to poor contact or fine impact or the like due to error coupling during the wafer inspection process.

The first alignment member 410 is a length-adjustable member, and various known components may be used, and there is no limitation on the shape or number.

In order to align the first stage unit 100 and the second stage unit 200, a second alignment member 420 is provided at the lower side of the second stage unit 200. The second alignment member 420 aligns the position of the second stage unit 200 in the third direction Z. Since the second alignment member 420 is only different from the first alignment member 410 in that it is provided in the second stage unit 200, and has the same function, the description thereof is replaced with the description of the first alignment member 410.

Meanwhile, a third alignment member 430 is provided to adjust the relative positions in the first direction X and the second direction Y between the first alignment member 410 and the second alignment member 420 whose horizontal and relative heights are aligned by the first alignment member 410 and the second alignment member 420.

As shown in FIG. 4, one side of the third alignment member 430 is fixed to the first stage unit 100 and the other side is fixed to the second stage unit 200.

In this case, a plurality of third alignment members 430 may be provided in the up-down direction. In the present embodiment, a total of two third alignment members 430 are provided, one at the upper side and one at the lower side. Accordingly, by precisely aligning the upper and lower sides, respectively, it is possible to remove the relative position difference between the first stage unit 100 and the second stage unit 200 according to the first direction X and the second direction Y.

The reason why the third alignment member 430 should be provided is that the weight of the first stage unit 100 and the second stage unit 200 is heavy, making it difficult to move the first stage unit 100 or the second stage unit 200 easily, and even if the first stage unit 100 or the second stage unit 200 is moved difficultly, it is difficult to adjust the position finely.

As shown in FIG. 5, the third alignment member 430 of the multi-wafer inspection system 1 according to an exemplary embodiment of the present invention includes a first body 431, a second body 432, a first screw 433, and a second screw 434.

As shown in FIG. 5, the first body 431 is fixed to the first stage unit 100. That is, the first body 431 is one side of the third alignment member 430 and is firmly coupled to the first stage unit 100.

As shown in FIG. 6, the first body 431 protrudes from the first stage unit 100 toward the loader unit 300.

As shown in FIGS. 5 and 6, the second body 432 formed to be separated from the first body 431 is fixed to the second stage unit 200. That is, the second body 432 is the other side of the third alignment member 430 and is firmly coupled to the second stage unit 200.

A first pressing surface 432*a* perpendicular to the first direction X toward the first stage unit 100 is formed in the second body 432. The first pressing surface 432*a* is formed to face the first body 431. A second pressing surface 432*b* perpendicular to the second direction Y is formed as one side of the first pressing surface 432*a* of the second body 432 toward the loader unit 300.

That is, the first pressing surface 432*a* is formed perpendicular to the first direction X, and the second pressing surface 432*b* is formed perpendicular to the second direction Y.

In this case, as shown in FIG. 6, the first body 431 is formed to be bent so as to be disposed to face the first pressing surface 432*a* and the second pressing surface 432*b*.

A first screw 433 is screw-coupled to one side of the bent first body 431. In this case, the first screw 433 is screw-coupled so as to reciprocate along the first direction X. The fore end of the first screw 433 is disposed to be in vertical contact with the first pressing surface 432*a*.

When the first screw 433 is rotated in one direction, the first screw 433 moves in the first direction X or the direction opposite to the first direction X relative to the first body 431, and the fore end presses the first pressing surface 432*a*. Accordingly, the first stage unit 100 and the second stage unit 200 may relatively move along the first direction X.

A second screw 434 is screw-coupled to the other side of the bent first body 431. In this case, the second screw 434 is screw-coupled so as to reciprocate along the second direction Y. The fore end of the second screw 434 is disposed to be in vertical contact with the second pressing surface 432*b*.

When the second screw 434 is rotated in one direction, the second screw 434 moves in the second direction Y or the direction opposite to the second direction Y relative to the first body 431, and the fore end presses the second pressing surface 432*b*. Accordingly, the first stage unit 100 and the second stage unit 200 may relatively move along the second direction Y.

As shown in FIG. 2, the loader unit 300 is detachably coupled to the second direction Y side of the first stage unit 100 and the second stage unit 200. The loader unit 300 supplies a plurality of wafers to a plurality of first probers 110 to sixth probers 230, respectively.

There is no limitation on the method in which the loader unit 300 supplies wafers to the first prober 110 to sixth prober 230, and various known methods may be applied. For example, as shown in FIG. 3 and FIG. 10, a space is formed inside the loader unit 300, and a loader 330 may be disposed in the internal space to move to the first prober 110 to the sixth prober 230 to supply the wafer 2 and the probe card 6 to each prober.

As shown in FIG. 2, a controller 310 is disposed in front of the right end of the loader unit 300. The controller 310 controls operations of the first prober 110 to the sixth prober 230. The user may determine whether to operate the first prober 110 to the sixth prober 230 or check the state of the first prober 110 to the sixth prober 230 through the controller 310. The controller 310 is connected to each prober by a first conductive member L1 to a sixth conductive member L6 to be described later.

A connection space 301 independent of the operation of the loader 330 is formed in the upper right end portion of the loader unit 300. The connection space 301 becomes a space through which the first conductive member L1 to the sixth conductive member L6 passes. Accordingly, the first conductive member L1 to the sixth conductive member L6 do not interfere with the operation of the loader 330 placed inside the loader unit 300 in the process of connecting the first prober 110 to the sixth prober 230 and the controller 310, respectively.

Meanwhile, as shown in FIG. 10, a plurality of loader unit alignment members 340 are provided below the loader unit 300. The loader unit alignment member 340 is formed to be adjustable in length so as to align the horizontality of the loader unit 300.

In this case, there is no limitation on a method of aligning the horizontality of the loader unit 300 by the loader unit alignment member 340. That is, various known components may be used as the loader unit alignment member 340. In addition, the loader unit alignment member 340 may be arranged in a grid arrangement structure, and there is no limit to the number of installations.

A first refrigerant space 151 through which a first refrigerant flow path F1 to be described later passes and a third refrigerant space 251 through which a third refrigerant flow path F2 to be described later passes are formed below the loader unit 300. The first refrigerant space 151 is arranged to correspond to the front and rear of the first stage unit 100, and the third refrigerant space 251 is arranged to correspond to the front and rear of the second stage unit 200. That is, the first refrigerant space 151 is disposed below the front of the first prober 110, and the third refrigerant space 251 is disposed below the front of the third prober 210.

As shown in FIGS. 3 and 10, the first refrigerant space 151 and the third refrigerant space 251 may be formed outside as a lower side of the frame constituting the loader unit 300. That is, the first refrigerant space 151 and the third refrigerant space 251 may be formed between a plurality of loader unit alignment members 340. Accordingly, it is possible to efficiently arrange the first refrigerant flow path F1 and the third refrigerant flow path F2, which will be described later, even if a separate space is not formed inside the loader unit 300.

Meanwhile, the first stage unit 100 and the second stage unit 200 coupled to the loader unit 300 are combined in an aligned state by the first alignment member 410 to the third alignment member 430 before being coupled to the loader unit 300.

To describe this in more detail, the first stage unit 100 and the second stage unit 200 are arranged adjacent to each other in the first direction X, as shown in FIG. 3.

The height and horizontality of the first stage unit 100 are adjusted by the above-described first alignment member 410 while being disposed on the right side of the second stage unit 200.

In a state in which the height and horizontality of the first stage unit 100 are adjusted, the height and horizontality of the second stage unit 200 are adjusted by the second alignment member 420. Accordingly, the first prober 110 and the second prober 120 disposed in the first stage unit 100 have the same height as the third prober 210 and the fourth prober 220 disposed in the second stage unit 200, respectively.

In a state in which the heights and horizontality of the first stage unit 100 and the second stage unit 200 are adjusted, the relative positions in the first direction X or the second direction Y between the first stage unit 100 and the second stage unit 200 are aligned by the third alignment member 430.

In a state of aligning the relative positions of the first stage unit 100 and the second stage unit 200, the first stage unit 100 and the second stage unit 200 are fixed by the first coupling member 610 disposed between the first stage unit 100 and the second stage unit 200.

One end of the first coupling member 610 is fixed to the first stage unit 100 and the other end is fixed to the second stage unit 200. There is no limitation on a method of being fixed to the first stage unit 100 and the second stage unit 200 by the first coupling member 610. For example, in a state in which a hole formed in the frame of the first stage unit 100 and, as a position corresponding to this hole, a hole formed in the frame of the second stage unit 200 are aligned by the third alignment member 430, a screw may be inserted and fixed into both holes.

In a state in which the first stage unit 100 and the second stage unit 200 are coupled by the first coupling member 610, the loader unit 300 is coupled to the first stage unit 100 and the second stage unit 200.

The loader unit 300 may be easily moved toward the first stage unit 100 and the second stage unit 200 by providing a moving member on the lower surface thereof. The moving member of the loader unit 300 is not limited to the parts used as long as the loader unit 300 may be easily moved even if the loader unit 300 is heavy. For example, it may be a wheel.

As shown in FIG. 4, the right end of the loader unit 300 is coupled by the second coupling member 620 in a state in which the loader unit 300 is moved to the first stage unit 100 and the second stage unit 200. In addition, the left end of the loader unit 300 is coupled by the third coupling member 630.

As shown in FIG. 3, the second coupling member 620 may be formed to extend in the right direction. A conductive member auxiliary space 141 is formed at the right end of the first stage unit 100. The conductive member auxiliary space 141 may be formed on the right side of the first prober 110 and the second prober 120 as the inside of the first stage unit 100. Alternatively, the first stage unit 100 may include a conductive member cabinet 140 formed on the right end surface, and the conductive member auxiliary space 141 may be formed inside the conductive member cabinet 140.

The second coupling member 620 extending in the right direction allows the right end of the loader unit 300 to extend to the front of the conductive member auxiliary space 141 formed at the right end of the first stage unit 100. That is, as shown in FIG. 3, a predetermined distance (d) is further extended from the first prober 110 to the right so that the right end of the loader unit 300 and the conductive member auxiliary space 141 may be arranged side by side in the second direction Y.

Accordingly, the conductive member auxiliary space 141 may be disposed adjacent to the connection space 301 in the loader unit 300. In addition, through the adjacent conductive member auxiliary space 141 and the connection space 301, the first conductive member L1 to the sixth conductive member L6 to be described later may connect the first prober 110 and the third prober 210 and the controller 310 of the loader unit 300 without interfering with the movement of the loader 330 inside the loader unit 300.

The third coupling member 630 fixes the end of the loader unit 300 in the first direction X, that is, the left end and the second stage unit 200. Accordingly, the right and left ends of the loader unit 300 may be coupled to the first stage unit 100 and the second stage unit 200, respectively.

A plurality of second coupling members 620 and third coupling members 630 may be provided. Accordingly, the second coupling member 620 and the third coupling member 630 may be disposed at a predetermined interval in the up-down direction.

Meanwhile, the fourth coupling member 640 fixes the end of the loader unit 300 in an opposite direction of the third direction Z, i.e., the lower end, and the first stage unit 100 and the second stage unit 200. There is no limit to the number of fourth coupling members 640. That is, a plurality of them may be provided at predetermined intervals at the lower end of the loader unit 300 to be coupled to the first stage unit 100 and the second stage unit 200.

There is no limitation on a method in which the second coupling member 620, the third coupling member 630, and the fourth coupling member 640 are coupled to the loader unit 300. For example, the second coupling member 620, the third coupling member 630, and the fourth coupling member 640 may be screw members that can directly fix the frames of the first stage unit 100, the second stage unit 200, and the loader unit 300, and as shown in FIG. 4, the second coupling member 620, the third coupling member 630, and the fourth coupling member 640 may include a separate fixing bracket to couple the frames of the first stage unit 100 and the second stage unit 200 and the frame of the loader unit 300 using the bracket.

Meanwhile, as shown in FIG. 2, a chiller unit 700 for supplying refrigerant to the first prober 110, the third prober 210, the second prober 120, the fourth prober 220, the fifth prober 130, and the sixth prober 230 is disposed on the left side of the second stage unit 200.

In this case, as shown in FIGS. 7 and 8, the chiller unit 700 is connected to the first prober 110 through the first refrigerant flow path F1. When a plurality of first probers 110 are provided, a plurality of first refrigerant flow paths F1 are also formed. The first refrigerant flow path F1 connects a plurality of first probers 110 and the chiller unit 700, respectively, via the first refrigerant space 151 and the third refrigerant space 251. That is, the first refrigerant flow path F1 passes through both the first stage unit 100 and the second stage unit 200 and is connected to the chiller unit 700 outside.

In this case, like the first refrigerant flow path F1, the second refrigerant flow path F3 connects a plurality of second probers 120 and the chiller unit 700 via the second refrigerant space 161 and the fourth refrigerant space 261, and the fifth refrigerant flow path F5 connects a plurality of fifth probers 130 and the chiller unit 700 via the fifth refrigerant space 171 and the sixth refrigerant space 271.

The first refrigerant flow path F1 includes a first refrigerant supply flow path F11 for supplying a refrigerant to the first prober 110 and a first refrigerant recovery flow path F12 for recovering the refrigerant from the first prober 110. That is, the refrigerant circulates through the chiller unit 700, the first refrigerant supply flow path F11, the first prober 110, and the first refrigerant recovery flow path F12 to maintain the internal environment of the first prober 110 at a low temperature.

In this case, a first refrigerant supply port 112 and a first refrigerant recovery port 113 are formed in the first prober 110 so that the first refrigerant supply flow path F11 and the first refrigerant supply flow path F11 may be connected. As shown in FIGS. 3, 7, 8, and 10, the first refrigerant supply port 112 and the first refrigerant recovery port 113 are formed to protrude forward toward the front surface of the first prober 110. That is, the first refrigerant supply port 112 and the first refrigerant recovery port 113 protrude toward the loader unit 300.

However, as shown in FIG. 10, one end of the first refrigerant supply flow path F11 and one end of the first refrigerant recovery flow path F12 are coupled to the first refrigerant supply port 112 and the first refrigerant recovery port 113 with each one end facing upward. Accordingly, the first refrigerant supply flow path F11 and the first refrigerant recovery flow path F12 do not protrude toward the loader unit 300, thereby not interfering with the movement of the loader 330.

Meanwhile, the third refrigerant flow path F2, the second refrigerant flow path F3, the fourth refrigerant flow path F4, the fifth refrigerant flow path F5, and the sixth refrigerant flow path F6 also include a third refrigerant supply flow path F21, a second refrigerant supply flow path F31, a fourth refrigerant supply flow path F41, a fifth refrigerant supply flow path F51, and a sixth refrigerant supply flow path F61, respectively, corresponding to the first refrigerant supply flow path F11, and a third refrigerant recovery flow path F22, a second refrigerant recovery flow path F32, a fourth refrigerant recovery flow path F42, a fifth refrigerant recovery flow path F52, and a sixth refrigerant recovery flow path F62, respectively, corresponding to the first refrigerant recovery flow path F12. In this case, descriptions of the third refrigerant supply flow path F21, the second refrigerant supply flow path F31, the fourth refrigerant supply flow path F41, the fifth refrigerant supply flow path F51, and the sixth refrigerant supply flow path F61, and the third refrigerant recovery flow path F22, the second refrigerant recovery flow path F32, the fourth refrigerant recovery flow path F42, the fifth refrigerant recovery flow path F52, and the sixth refrigerant recovery flow path F62 will be replaced by descriptions of the first refrigerant supply flow path F11 and the first refrigerant recovery flow path F12.

In addition, the third prober 210 to the sixth prober 230 includes a third refrigerant supply port 212 to a sixth refrigerant supply port 232 corresponding to the first refrigerant supply port 112, and a third refrigerant recovery port 213 to a sixth refrigerant recovery port 233 corresponding to the first refrigerant recovery port 113, respectively. In this case, descriptions of the third refrigerant supply port 212 to the sixth refrigerant supply port 232 and the third refrigerant recovery port 213 to the sixth refrigerant recovery port 233 are replaced with descriptions of the first refrigerant supply port 112 and the first refrigerant recovery port 113.

As shown in FIGS. 7 and 8, the chiller unit 700 is connected to the third prober 210 through the third refrigerant flow path F2. When a plurality of third probers 210 are provided, a plurality of third refrigerant flow paths F2 are also formed. The third refrigerant flow path F2 connects a plurality of third probers 210 and the chiller unit 700, respectively, via the third refrigerant space 251.

In this case, like the third refrigerant flow path F2, the fourth refrigerant flow path F4 connects a plurality of fourth probers 220 and the chiller unit 700 via the fourth refrigerant space 261, and the sixth refrigerant flow path F6 connects a plurality of sixth probers 230 and the chiller unit 700 via the sixth refrigerant space 271.

If the first refrigerant flow path F1 to the sixth refrigerant flow path F6 can supply the cooled refrigerant to the first prober 110 to the sixth prober 230 by passing through the chiller unit 700, there is no limitation in the material or shape of the flow path. For example, the first refrigerant flow path F1 to the sixth refrigerant flow path F6 may be a hose or pipe through which a refrigerant may move. In the present embodiment, it is described that the first refrigerant flow path F1 to the sixth refrigerant flow path F6 are made of a hose that is easy to attach and detach to meet the purpose of providing a multi-wafer inspection system 1 capable of separation and coupling, which is the core of the technical idea of the present invention.

Meanwhile, in order to easily couple a plurality of first refrigerant flow paths F1 and the chiller unit 700, as shown in FIG. 7, a refrigerant flow path auxiliary space 241 is formed at the left end of the second stage unit 200. The refrigerant flow path auxiliary space 241 may be formed on the left side of the third prober 210 and the fourth prober 220 as the inside of the second stage unit 200. Alternatively, the second stage unit 200 may include a refrigerant flow path cabinet 240 formed on the left end surface of the second stage unit 200, and the refrigerant flow path auxiliary space 241 may be formed inside the refrigerant flow path cabinet 240.

As shown in FIG. 11, a plurality of second refrigerant flow paths F3 to sixth refrigerant flow paths F6 may be arranged in the refrigerant flow path auxiliary space 241. The plurality of arranged second refrigerant flow paths F3 to sixth refrigerant flow paths F6 are neatly arranged and fixed in the refrigerant flow path auxiliary space 241.

Meanwhile, as shown in FIG. 2, a plurality of chiller units 700 may be provided. The number of chiller units 700 may vary depending on the number of probers provided in the multi-wafer inspection system 1. In the present embodiment, the multi-wafer inspection system 1 includes a total of 12 probers consisting of three rows and four columns, and accordingly, three chiller units 700 are provided so that one chiller unit 700 can take charge of one row to supply refrigerant to a total of four probers.

To describe this in more detail, in the second chiller unit 720, two second probers 120 of the first stage unit 100 and two fourth probers 220 of the second stage unit 200 are connected by a second refrigerant flow path F3 and a fourth refrigerant flow path F4, respectively, and in the third chiller unit 730, two fifth probers 130 of the first stage unit 100 and two sixth probers 230 of the second stage unit 200 are connected by a fifth refrigerant flow path F5 and a sixth refrigerant flow path F6, respectively.

In this case, a flow path fixing member 500 may be provided in the refrigerant flow path auxiliary space 241 so that by easily distinguishing the second refrigerant flow path F3 and the fourth refrigerant flow path F4 to be connected to the second chiller unit 720, the person assembling the multi-wafer inspection system 1 may connect them to the second chiller unit 720 rather than the third chiller unit 730. The shape of the flow path fixing member 500 is not limited as long as the second refrigerant flow path F3 and the fourth refrigerant flow path F4 may be easily fixed.

A plurality of flow path fixing members 500 may be provided. Accordingly, the flow path fixing member 500 may fix the fifth refrigerant flow path F5 and the sixth refrigerant flow path F6 similarly to fixing the second refrigerant flow path F3 and the fourth refrigerant flow path F4 to the refrigerant flow path auxiliary space 241.

The fifth refrigerant flow path F5 and the sixth refrigerant flow path F6 may be coupled to the third chiller unit 730 via the refrigerant flow path auxiliary space 241.

Meanwhile, as shown in FIG. 11, the first refrigerant flow path F1 and the third refrigerant flow path F2 may be directly coupled to the third chiller unit 730 without directly passing through the refrigerant flow path auxiliary space 241, but the present invention is not limited thereto and may be designed to pass through the refrigerant flow path auxiliary space 241.

Meanwhile, as shown in FIGS. 3 and 9, the first stage unit 100 includes a plurality of first electric connection spaces 180 and a second electric connection space 190.

The first electric connection space 180 extends in a direction opposite to the second direction Y of the first stage unit 100, that is, toward the rear side, and in the up-down direction at one side of the plurality of first probers 110, respectively. In this case, the position of one side of the first prober 110 in which the first electric connection space 180 is formed may be the left or right side of the first prober 110. In the present embodiment, as shown in FIG. 9, it is formed to extend in the up-down direction to the right side of the first prober 110.

The number of the first electric connection spaces 180 varies according to the number of a plurality of first probers 110. As in the present embodiment shown in FIG. 9, when two first probers 110 are disposed left and right, two first electric connection spaces 180 are also formed to correspond to the number of first probers 110.

The first electric connection space 180 is not limited in a method formed as long as it may extend in the up-down direction at the above-described position. For example, it may be formed inside the first stage unit 100 by a frame constituting the first stage unit 100, or it may be formed inside a pillar supporting the inside of the first stage unit 100.

The first electric connection space 180 is disposed to be spaced apart from the second refrigerant space 161 and the fifth refrigerant space 171 formed in front of the first stage unit 100. Accordingly, the first conductive member L1, the second conductive member L3, the fifth conductive member L5, the second refrigerant flow path F3 and the fifth refrigerant flow path F5 to be described later, which pass through the inside of the first electric connection space 180, can be disposed to be spaced apart from each other. That is, the first conductive member L1, the second conductive member L3, and the fifth conductive member L5 can be prevented from being affected by the second refrigerant flow path F3 and the fifth refrigerant flow path F5, thereby preventing the first conductive member L1 and the second conductive member L3 from being damaged.

In addition, the second refrigerant flow path F3 and the fifth refrigerant flow path F5 and the first conductive member L1, the second conductive member L3 and the fifth conductive member L5 are disposed to be spaced apart from each other, while the second refrigerant flow path F3 and the fifth refrigerant flow path F5 are connected to the chiller unit 700 along the left-right direction, and the first conductive member L1, the second conductive member L3, and the fifth conductive member L5 are connected to the controller 310 along the up-down direction, so that a person assembling the multi-wafer inspection system 1 can easily distinguish the refrigerant flow path from the conductive member.

Furthermore, the first conductive member L1, the second conductive member L3, and the fifth conductive member L5, which are relatively required for maintenance, are arranged at the back so that the user can easily perform maintenance outside the rear of the first stage unit 100.

As shown in FIG. 9, the second electric connection space 190 is connected to lower ends of the plurality of first electric connection spaces 180. To this end, the second electric connection space 190 is formed to extend in the left-right direction at the lower rear end of the first stage unit 100.

The second electric connection space 190 is not limited in a method formed as long as it may extend in the left-right direction at the above-described position. For example, it may be formed inside the first stage unit 100 by a frame constituting the first stage unit 100, or it may be formed inside a frame unit supporting the inside of the first stage unit 100.

Since the second electric connection space 190 is formed at the rear of the first stage unit 100 like the first electric connection space 180, a person assembling the multi-wafer inspection system 1 can easily distinguish and install the refrigerant flow path and the conductive member like the first electric connection space 180.

Meanwhile, the second stage unit 200 also includes a third electric connection space 280 and a fourth electric connection space 290, respectively, corresponding to the first electric connection space 180 and the second electric connection space 190 of the first stage unit 100. In this case, among the descriptions of the third electric connection space 280 and the fourth electric connection space 290, descriptions overlapping those of the first electric connection space 180 and the second electric connection space 190 will be omitted.

The third electric connection space 280 extends toward the rear side of the second stage unit 200, and in the up-down direction at one side of the plurality of third probers 210, respectively. In this case, the position of one side of the third prober 210 in which the third electric connection space 280 is formed may be the left or right side of the third prober 210. In the present embodiment, as shown in FIG. 9, it is formed to extend in the up-down direction to the right side of the third prober 210.

The number of the third electric connection spaces 280 varies according to the number of a plurality of third probers 210. As in the present embodiment shown in FIG. 9, when two third probers 210 are disposed left and right, two third electric connection spaces 280 are also formed to correspond to the number of third probers 210.

As shown in FIG. 9, the fourth electric connection space 290 is connected to lower ends of the plurality of third electric connection spaces 280. To this end, the fourth electric connection space 290 is formed to extend in the left-right direction at the lower rear end of the second stage unit 200.

In addition, the fourth electric connection space 290 is formed at the same height as the second electric connection space 190. Accordingly, the third conductive member L2, the fourth conductive member L4, and the sixth conductive member L6 to be described later may be connected to the controller 310 via the fourth electric connection space 290 and the second electric connection space 190.

As shown in FIGS. 9 and 12, the first conductive member L1 connects the first prober 110 and the controller 310. The first conductive member L1, as a kind of wire, may supply a control signal of the controller 310 to the first prober 110 as well as supply power to the first prober 110 through the controller 310.

To this end, the first conductive member L1 has one end connected to the electric component 4 disposed in the first electric space 111, and the other end connected to the controller 310 by sequentially passing through the first electric space 111, the first electric connection space 180, the second electric connection space 190, and the connection space 301.

At this time, as shown in FIGS. 9 and 12, the first conductive member L1 may further pass through the conductive member auxiliary space 141. That is, it may connect the first prober 110 and the controller 310 by sequentially passing through the first electric space 111, the first electric connection space 180, the second electric connection space 190, the conductive member auxiliary space 141, and the connection space 301.

In this case, the first conductive member L1 may be divided into a first prober conductive member L11 and a first controller conductive member L12, and the first prober conductive member L11 and the first controller conductive member L12 may be connected by a connection member 800 disposed in the conductive member auxiliary space 141.

To describe this in more detail, as shown in FIGS. 9 and 12, the first prober conductive member L11 connects the electric component 4 and the connection member 800 via the first electric space 111, the first electric connection space 180, the second electric connection space 190, and the conductive member auxiliary space 141. In addition, the first controller conductive member L12 connects the connection member 800 and the controller 310 via the conductive member auxiliary space 141 and the connection space 301.

That is, the connection member 800 serves to allow the first prober conductive member L11 and the first controller conductive member L12 to be coupled to each other. The connection member 800 is not limited as long as the first prober conductive member L11 and the first controller conductive member L12 may be energizably coupled to each other. For example, the connection member 800 may connect the first prober conductive member L11 and the first controller conductive member L12 in an electrical outlet manner.

As shown in FIGS. 9 and 12, the third conductive member L2 connects the third prober 210 and the controller 310. The third conductive member L2, as a kind of wire like the first conductive member L1, may supply a control signal of the controller 310 to the third prober 210 as well as supply power to the third prober 210 through the controller 310.

To this end, the third conductive member L2 has one end connected to the electric component 4 disposed in the third electric space 211, and the other end connected to the controller 310 by sequentially passing through the third electric space 211, the third electric connection space 280, the fourth electric connection space 290, and the connection space 301.

At this time, the third conductive member L2 may further pass through the conductive member auxiliary space 141. That is, it may connect the third prober 210 and the controller 310 by sequentially passing through the third electric space 211, the third electric connection space 280, the fourth electric connection space 290, the second electric connection space 190, the conductive member auxiliary space 141, and the connection space 301.

In this case, the third conductive member L2 may be divided into a second prober conductive member L21 and a third controller conductive member L22, and the second prober conductive member L21 and the third controller conductive member L22 may be connected by a connection member 800 disposed in the conductive member auxiliary space 141.

To describe this in more detail, as shown in FIG. 9, the second prober conductive member L21 connects the electric component 4 and the connection member 800 via the third electric space 211, the third electric connection space 280, the fourth electric connection space 290, the second electric connection space 190, and the conductive member auxiliary space 141. In addition, the third controller conductive member L22 connects the connection member 800 and the controller 310 via the conductive member auxiliary space 141 and the connection space 301.

That is, if a person assembling the multi-wafer inspection system 1 cares only about coupling the first prober conductive member L11 and the second prober conductive member L21 to the connection member 800, it is possible to easily connect the first controller conductive member L12 and the third controller conductive member L22 to the controller 310 together. This makes it possible to easily connect each prober and the controller 310 when the first stage unit 100 and the second stage unit 200 are first coupled and then the loader unit 300 is coupled.

As described above, by forming a space in the first stage unit 100, the second stage unit 200, and the loader unit 300 in which the first prober 110 and the third prober 210 and the controller 310 can be easily connected, a person assembling the multi-wafer inspection system 1 can not only arrange the positions of the first conductive member L1 and the third conductive member L2 without any special consideration, but also optimize and minimize the overall size of the multi-wafer inspection system 1.

Meanwhile, the second conductive member L3 connects the second prober 120 to the controller 310. In this case, to connect the electric component 4 disposed in the second electric space 121 to the controller 310, the second conductive member L3 has one end connected to the electric component 4 disposed in the second electric space 121, and the other end connected to the controller 310 by sequentially passing through the second electric space 121, the first electric connection space 180, the second electric connection space 190, the conductive member auxiliary space 141, and the connection space 301.

In this case, the second conductive member L3 may be divided into a second prober conductive member L31 and a second controller conductive member L32, similar to the first conductive member L1. However, the description thereof will be replaced with the description of the first conductive member L1.

The fourth conductive member L4 connects the fourth prober 220 to the controller 310. In this case, to connect the electric component 4 disposed in the fourth electric space 221 to the controller 310, the fourth conductive member L4 has one end connected to the electric component 4 disposed in the fourth electric space 221, and the other end connected to the controller 310 by sequentially passing through the fourth electric space 221, the third electric connection space 280, the fourth electric connection space 290, the second electric connection space 190, the conductive member auxiliary space 141, and the connection space 301.

In this case, the fourth conductive member L4 may also be divided into a fourth prober conductive member L41 and a fourth controller conductive member L42, similar to the third conductive member L2. However, the description thereof will be replaced with the description of the third conductive member L2.

The fifth conductive member L5 connects the fifth prober 130 to the controller 310. In this case, to connect the electric component 4 disposed in the fifth electric space 131 to the controller 310, the fifth conductive member L5 has one end connected to the electric component 4 disposed in the fifth electric space 131, and the other end connected to the controller 310 by sequentially passing through the fifth electric space 131, the first electric connection space 180, the second electric connection space 190, and the connection space 301.

In this case, the fifth conductive member L5 may also be divided into a fifth prober conductive member L51 and a fifth controller conductive member L52, similar to the first conductive member L1. However, the description thereof will be replaced with the description of the first conductive member L1.

The sixth conductive member L6 connects the sixth prober 230 to the controller 310. In this case, to connect the electric component 4 disposed in the sixth electric space 231 to the controller 310, the sixth conductive member L6 has one end connected to the electric component 4 disposed in the sixth electric space 231, and the other end connected to the controller 310 by sequentially passing through the sixth electric space 231, the third electric connection space 280, the fourth electric connection space 290, the second electric connection space 190, the conductive member auxiliary space 141, and the connection space 301.

In this case, the sixth conductive member L6 may also be divided into a sixth prober conductive member L61 and a sixth controller conductive member L62, similar to the third conductive member L2. However, the description thereof will be replaced with the description of the third conductive member L2.

Hereinafter, an installation process of the multi-wafer inspection system 1 according to an exemplary embodiment of the present invention will be comprehensively described.

The first stage unit 100 and the second stage unit 200 are arranged side by side. In this case, the front of the first stage unit 100 and the front of the second stage unit 200 are arranged to face the same direction.

The horizontality of the first stage unit 100 and the second stage unit 200 is adjusted by the first alignment member 410 and the second alignment member 420, respectively. In this case, the heights of the first stage unit 100 and the second stage unit 200 are also adjusted.

The front and side relative positions of the first stage unit 100 and the second stage unit 200 whose height has been adjusted are aligned by the third alignment member 430.

After the first stage unit 100 and the second stage unit 200, which are heavy, are precisely aligned by the third alignment member 430, the first stage unit 100 and the second stage unit 200 are coupled by the first coupling member 610.

The loader unit 300 is disposed in front of the combined first stage unit 100 and the second stage unit 200, and the first stage unit 100 and the loader unit 300, and the second stage unit 200 and the loader unit 300 are coupled by the second coupling member 620 to the fourth coupling member 640.

The first refrigerant flow path F1 to the sixth refrigerant flow path F6 are arranged. More specifically, the first refrigerant flow path F1 is arranged to pass through the first refrigerant space 151 and the third refrigerant space 251 with one end thereof connected to the first prober 110, and the third refrigerant flow path F2 is arranged to pass through the third refrigerant space 251 with one end thereof connected to the third prober 210.

In order, the second refrigerant flow path F3 to the sixth refrigerant flow path F6 are also arranged in the same manner as the first refrigerant flow path F1 and the third refrigerant flow path F2 and are fixed by the flow path fixing member 500.

However, the second refrigerant flow path F3 to the sixth refrigerant flow path F6 are arranged to pass through the refrigerant flow path auxiliary space 241. In this case, the second refrigerant flow path F3 to the sixth refrigerant flow path F6 are fixed by the flow path fixing member 500 in the refrigerant flow path auxiliary space 241.

The first refrigerant flow path F1 and the third refrigerant flow path F2 are connected to the first chiller unit 710, the second refrigerant flow path F3 and the fourth refrigerant flow path F4 are connected to the second chiller unit 720, and the fifth refrigerant flow path F5 and the sixth refrigerant flow path F6 are connected to the third chiller unit 730.

The first conductive member L1 to the sixth conductive member L6 are arranged. More specifically, the first conductive member L1, the second conductive member L3, and the fifth conductive member L5 are connected to the first prober 110, the second prober 120, and the fifth prober 130 with their one ends, respectively, and then are arranged to pass through the first electric connection space 180, the second electric connection space 190, the conductive member auxiliary space 141, and the connection space 301, and are connected to the controller 310 with their other ends.

On the other hand, the third conductive member L2, the fourth conductive member L4, and the sixth conductive member L6 are connected to the third prober 210, the fourth prober 220, and the sixth prober 230 with their one ends, respectively, and then are arranged to pass through the third electric connection space 280, the fourth electric connection space 290, the second electric connection space 190, the conductive member auxiliary space 141, and the connection space 301, and are connected to the controller 310 with their other ends.

As described above, preferred embodiments according to the present invention have been examined, and it is obvious to those skilled in the art that the present invention can be embodied in other specific forms without departing from the spirit or scope of the present invention in addition to the above-described embodiments. Therefore, the above-described embodiments are to be construed as illustrative rather than restrictive, and accordingly, the present invention is not limited to the above description and may be modified within the scope of the appended claims and their equivalents.

What is claimed is:

1. A multi-wafer inspection system capable of simultaneously inspecting multiple wafers supplied thereto, the multi-wafer inspection system comprising:

a first stage unit comprising multiple first probers controlled such that the multiple wafers can be inspected individually, and disposed side by side in a first direction;

a loader unit disposed in a second direction perpendicular to the first direction of the first stage unit such that the multiple wafers are supplied to the multiple first probers, respectively;

a chiller unit for supplying a refrigerant to the multiple first probers;

a controller disposed on the opposite side of the loader unit to the first direction in order to control the first probers; and multiple first conductive members for connecting the multiple first probers and the controller, respectively, wherein the loader unit comprises a connection space formed on a third direction side perpendicular to the first direction and the second direction of the loader unit, and the first conductive member connects the first prober and the controller via the connection space, wherein the first stage unit further comprises a conductive member auxiliary space formed on one side of the first stage unit, and the first conductive member sequentially passes through the conductive member auxiliary space and the connection space to connect the first prober to the controller, and wherein the first stage unit further comprises:

multiple first electric connection spaces extending in the third direction, respectively, on one side of the multiple first probers as opposite sides of the second direction of the first stage unit; and a second electric connection space extending along the first direction on the opposite side of the third direction of the first stage unit and coupled to ends on the opposite side of the third direction of the multiple first electric connection spaces, and the first conductive member sequentially passes through the first electric connection space, the second electric connection space, the conductive member auxiliary space, and the connection space to connect the first prober to the controller.

2. The multi-wafer inspection system of claim 1, wherein one end of the loader unit extends to the conductive member auxiliary space of the first stage unit.

3. The multi-wafer inspection system of claim 1, wherein the first stage unit further comprises:

multiple second probers disposed parallel to each other in the first direction, stacked on the third direction side of the multiple first probers, and controlled by the controller, and wherein the multi-wafer inspection system further comprises multiple second conductive members for connecting the multiple second probers and the controller, respectively.

4. The multi-wafer inspection system of claim 3, wherein the second conductive member sequentially passes through the conductive member auxiliary space and the connection space to connect the second prober to the controller.

5. The multi-wafer inspection system of claim 1, wherein the first prober comprises a first electric space formed on the side of the first prober in a direction opposite to the second direction, and the first conductive member sequentially passes through the first electric space, the first electric connection space, the second electric connection space, the conductive member auxiliary space, and the connection space to connect the first prober to the controller.

6. The multi-wafer inspection system of claim 5, further comprising:

a first stage unit detachably coupled to a first direction side of the first stage unit and comprising multiple third probers controlled by the controller such that the multiple wafers can be inspected individually, and disposed side by side in the first direction; and multiple third conductive members for connecting the multiple third probers and the controller, respectively, wherein the loader unit is detachably coupled to a second direction side perpendicular to the first direction of the first stage unit and the second stage unit, and supplies the multiple wafers to the multiple first probers and the multiple third probers, respectively.

7. The multi-wafer inspection system of claim 6, wherein the second stage unit further comprises:

multiple third electric connection spaces extending in the third direction, respectively, on one side of the multiple third probers as opposite sides of the second direction of the second stage unit; and a fourth electric connection space extending along the first direction on the opposite side of the third direction of the second stage unit, coupled to ends on the opposite side of the third direction of the multiple third electric connection spaces, and arranged at a position corresponding to the position of the second electric connection space along the third direction, and the third conductive member sequentially passes through the third electric connection space, the fourth electric connection space, the second electric connection space, the conductive member auxiliary space, and the connection space to connect the third prober to the controller.

8. The multi-wafer inspection system of claim 7, wherein the third prober comprises a third electric space formed on the side of the third prober in a direction opposite to the second direction, and the third conductive member sequentially passes through the third electric space, the third electric connection space, the fourth electric connection space, the second electric connection space, the conductive member auxiliary space, and the connection space to connect the third prober to the controller.

* * * * *